(12) United States Patent
Azaria et al.

(10) Patent No.: US 12,496,432 B2
(45) Date of Patent: Dec. 16, 2025

(54) DETECTION OF CATHETER LOCATION, ORIENTATION, AND MOVEMENT DIRECTION

(71) Applicant: Biosense Webster (Israel) Ltd., Yokneam (IL)

(72) Inventors: Elad Azaria, Ramat Gan (IL); Tamir Avraham Yellin, Yokneam Hamoshava (IL); Dan Sztejnberg, Hertzliya (IL); Michael Maydel, Haifa (IL); Alon Ben Natan, Kiryat Bialik (IL)

(73) Assignee: Biosense Webster (Israel) Ltd., Yokneam (IL)

( * ) Notice: Subject to any disclaimer, the term of this patent is extended or adjusted under 35 U.S.C. 154(b) by 560 days.

(21) Appl. No.: 16/799,338

(22) Filed: Feb. 24, 2020

(65) Prior Publication Data

US 2021/0260337 A1     Aug. 26, 2021

(51) Int. Cl.
*A61B 5/00* (2006.01)
*A61B 5/06* (2006.01)
(Continued)

(52) U.S. Cl.
CPC ......... *A61M 25/0105* (2013.01); *A61B 5/063* (2013.01); *A61B 5/066* (2013.01);
(Continued)

(58) Field of Classification Search
CPC .................. A61B 2034/2051; A61B 34/20
See application file for complete search history.

(56) References Cited

U.S. PATENT DOCUMENTS

| 2006/0241401 A1 | 10/2006 | Govari et al. |
| 2007/0060832 A1 | 3/2007 | Levin |
| (Continued) | | |

FOREIGN PATENT DOCUMENTS

| JP | 2002-511293 A | 4/2002 |
| JP | 2007-061612 A | 3/2007 |
| WO | 2018/237187 A2 | 12/2018 |

OTHER PUBLICATIONS

Extended European Search Report dated Jun. 24, 2021 for European Patent Application No. 21158610.2.
(Continued)

*Primary Examiner* — Pascal M Bui Pho
*Assistant Examiner* — Gabriel Victor Popescu
(74) *Attorney, Agent, or Firm* — Volpe Koenig

(57) ABSTRACT

Methods, apparatus, and systems for medical procedures are disclosed herein and include a catheter having a first electrode and a second electrode, the first electrode configured to transmit first electromagnetic signals and the second electrode configured to transmit second electromagnetic signals. A first patch, a second patch, and a third patch each configured to receive the first and second electromagnetic signals are included and arranged in a triangular formation on a first surface of a patient's body. A first catheter position relative to the first patch, the second patch, and the third patch, is determined at a first time and a second time. The first catheter position and the second catheter position relative to the first catheter position may be displayed such that the first catheter position is visually connected to the second catheter position.

20 Claims, 15 Drawing Sheets

(51) Int. Cl.
  *A61M 25/01* (2006.01)
  *A61B 34/20* (2016.01)
  *A61M 25/02* (2006.01)

(52) U.S. Cl.
  CPC .............. *A61B 5/068* (2013.01); *A61B 5/742* (2013.01); *A61B 2034/2051* (2016.02); *A61M 2025/0166* (2013.01); *A61M 2025/0266* (2013.01); *A61M 2210/125* (2013.01)

(56) References Cited

U.S. PATENT DOCUMENTS

| | | | |
|---|---|---|---|
| 2008/0177175 A1 | 7/2008 | Mottola et al. | |
| 2009/0076483 A1* | 3/2009 | Danehorn | A61M 25/01 604/526 |
| 2010/0079158 A1* | 4/2010 | Bar-Tal | A61B 5/06 324/705 |
| 2013/0066193 A1 | 3/2013 | Olson et al. | |
| 2019/0192042 A1 | 6/2019 | Gliner | |
| 2019/0365463 A1* | 12/2019 | Govari | A61B 5/0538 |
| 2020/0093397 A1* | 3/2020 | Sra | A61B 6/485 |
| 2023/0000562 A1* | 1/2023 | Ibragimov | A61B 5/063 |

OTHER PUBLICATIONS

Communication pursuant to Article 94(3) EPC dated Feb. 24, 2023 for European Patent Application No. 21158610.2.

De Lambert, A et al. "Electromagnetic tracking for registration and navigation in endovascular aneurysm repair: a phantom study." European journal of vascular and endovascular surgery : the official journal of the European Society for Vascular Surgery vol. 43,6 pp. 684-689 (2012).

Japanese Office Action issued on Oct. 15, 2024 for Japanese Patent Application No. 2021-025986.

* cited by examiner

DETECTION OF CATHETER LOCATION, ORIENTATION, AND MOVEMENT DIRECTION

FIELD OF INVENTION

The present disclosure relates to systems, apparatuses, and methods for improving medical procedures and mapping.

BACKGROUND

Medical conditions such as cardiac arrhythmia (e.g., atrial fibrillation (AF)) are often diagnosed and treated via intra-body procedures. For example, electrical pulmonary vein isolation (PVI) from the left atrial (LA) body is performed using ablation for treating AF. PVI, and many other minimally invasive catheterizations, cause damage to targeted organ tissue to prevent electrical activity through the organ tissue. Such procedures often require catheters and/or other inserted components to traverse a portion of a patient's body to reach an intended location.

Intra-body navigation of catheters and/or other inserted components can be visually assisted by techniques such as fluoroscopy or location pads that emit signals for location tracking via magnetic probes. Such techniques are often problematic due to potential radiation exposure, the number or complexity of components involved, or time consuming calibrations.

SUMMARY

Methods, apparatus, and systems for medical procedures are disclosed herein and include a catheter including a first electrode and a second electrode, the first electrode configured to transmit first electromagnetic signals and the second electrode configured to transmit second electromagnetic signals. A first patch, a second patch, and a third patch each configured to receive the first and second electromagnetic signals are included and arranged in a triangular formation on a first surface of a patient's body.

A processor is configured to determine, at a first time, a first catheter position relative to the first patch, the second patch, and the third patch, based on the first electromagnetic signals and the second electromagnetic signals received at the first patch, the second patch, and the third patch.

The processor may determine, at a second time, a second catheter position relative to the first patch, the second patch, the third patch, based on the signal strength of the first electromagnetic signals and the second electromagnetic signals received at the first patch, the second patch, and the third patch.

The processor may provide the first catheter position and the second catheter position relative to the first catheter position, to a display such that the first catheter position is visually connected to the second catheter position, wherein the first catheter position and the second catheter position each comprise a location and an orientation.

BRIEF DESCRIPTION OF THE DRAWINGS

A more detailed understanding can be had from the following description, given by way of example in conjunction with the accompanying drawings wherein.

DETAILED DESCRIPTION

Figure 1:
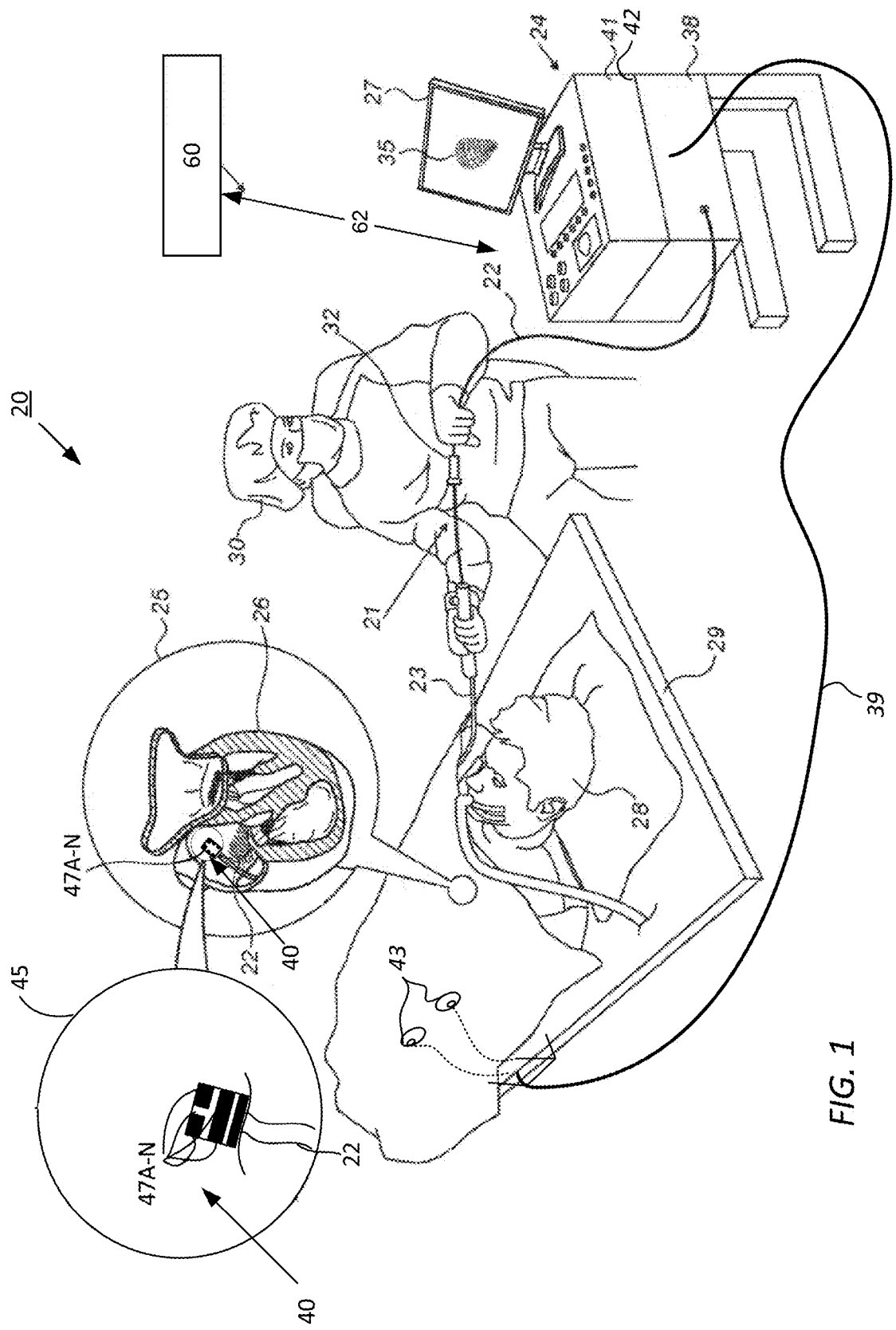
FIG. 1 is a diagram of an example system of the disclosed subject matter.

According to implementations of the disclosed subject matter, a catheter position relative to a plurality of sensing components (e.g., body surface patches, external electrodes, transceivers, etc.), commonly referred to as "patches" herein, may be determined. The catheter position may include both a location and an orientation of the catheter relative to the patches and guide a medical professional as the catheter is traversing a patient's body. For example, the location and orientation information conveyed by the catheter position may enable a medical professional to determine if the catheter is oriented in the right direction, if the catheter is traversing towards a target, if the catheter has encountered a blockage, or the like.

The catheter position may be provided relative to a plurality of patches such that the catheter position is not an absolute position in accordance with pre-determined coordinates but rather a relative position, relative to the patches. By determining the relative position, the initial insertion point of the catheter need not be necessary, allowing for a calibration free set-up. Further, detecting a relative position instead of an absolute position enables components on the catheter (e.g., electrodes) to transmit electromagnetic signals that are received by the patches, instead of calibrated patches and/or location pad(s) transmitting electromagnetic signals to be received by the catheter. This may reduce the electromagnetic activity within a patient's body and may also provide a single source of transmission. Additionally, obtaining the relative position of a catheter may prevent the need for time and resource intensive calibration of coordinates, such as with the use of a location pad placed near a patient's body.

The patches, as disclosed herein, may be applied to one or more surfaces of a patient's body (e.g., a front surface and/or a back surface). A plurality of patches may be used to determine a two dimensional and/or three-dimensional catheter location. A catheter may include a plurality of components (e.g., electrodes) that transmit electromagnetic signals that are received by the patches. For example, a first catheter electrode may transmit first electromagnetic signals and a second catheter electrode may transmit second electrode configured to transmit second electromagnetic signals. A given patch may receive both the first electromagnetic signals and the second electromagnetic signals. A processor, such as processor 41 of FIG. 1, as further disclosed herein, may be configured to compare the first and second electromagnetic signals to determine the orientation of the catheter. For example, if the first electrode is at the top of the catheter, the second electrode is at the bottom of the catheter, and a given patch receives first electromagnetic signals from the first electrode with an amplitude of 0.5 mV and second electromagnetic signals from the second electrode with an amplitude of 0.7 mV, then the processor may determine that the bottom of the catheter is closer to the given patch that then top of the catheter.

According to implementations of the disclosed subject matter, a set of at least three patches may be arranged in a triangular configuration on a first surface (e.g., top surface) of a patient's body. These patches may be configured to receive electromagnetic signals transmitted by the components (e.g., electrodes) of a catheter that is inserted into the patient's body. Based on the properties of the electromagnetic signals received by the set of at least three patches, a position (i.e., location and orientation) of the catheter relative to the at least three patches may be determined. Notably, as the set of at least three patches is approximately on a single surface (i.e., plane) of the patient's body, the position at this stage would be a two-dimensional position. Here, being approximately on a single/same surface or plane means that the set of patches have a significant majority weight (e.g., 90%) of their coordinates within the same dimensions (e.g., a Z dimensions relative to the patient's body). For example, slight fluctuation of the patch coordinates based on muscle, bone, tissue heights, depths, or curves still result in a set of patches being approximately on the single/same surface or plane.

A set of at least three patches may receive electromagnetic signals from a plurality of electrodes on a catheter. A processor may determine a relative catheter position based on the electromagnetic signals received at the set of at least three patches. Notably, the set of at least three patches may be arranged in a triangular configuration such that they define a two-dimensional plane. The processor may determine the relative catheter position within this two-dimensional plane.

According to an implementation, one or more additional fourth patches may be arranged on the same first surface as the set of at least three patches. A first patch and the first patch may create a virtual directional line. The electromagnetic signals received at a first patch and the fourth patch may be combined (e.g., averaged, normalized, etc.) such that the combined reading is applied to determine portion of the catheter's position in the direction perpendicular to the virtual directional line. Combining the electromagnetic signals at two or more patches, in this manner, may reduce error when determining the catheter position.

According to another implementation, one or more additional fourth patches may be arranged on the opposite surface (e.g., second surface) as the first body surface. The second surface may be parallel to the first surface (e.g., a back facing second surface and a chest facing first surface). Such one or more additional fourth patches may provide an additional dimension such that the catheter position may be a three-dimensional relative position.

FIG. 1 is a diagram of an exemplary system 20 in which one or more exemplary features of the present invention can be implemented. System 20 may include components, such as a catheter 40, that are configured to traverse portions of a patient body and reach a target location (e.g., a heart or a cardiac chamber). The components, such as catheter 40, may be further configured to map internal portions of a patient's body or may be used to perform a treatment such as by damaging tissue areas of an intra-body organ. The catheter 40 may also be further configured to obtain biometric data. Although catheter 40 is shown to be a single point catheter with multiple electrodes 47A-N, it will be understood that a catheter of any shape that includes one or more elements (e.g., electrodes) may be used to implement the embodiments disclosed herein. System 20 includes a probe 21, having shafts that may be navigated by a physician 30 into a body part, such as heart 26, of a patient 28 lying on a bed 29. According to implementations, multiple probes may be provided. However, for purposes of conciseness, a single probe 21 is described herein but it will be understood that probe 21 may represent multiple probes. As shown in FIG. 1, physician 30 may insert shaft 22 through a sheath 23, while manipulating the distal end of the shaft 22 using a manipulator 32 near the proximal end of the catheter 40 and/or deflection from the sheath 23. As shown in an inset 25, catheter 40 may be fitted at the distal end of shaft 22. Catheter 40 may be inserted through sheath 23 in a collapsed state and may be then expanded within heart 26. Catheter 40, as set forth above, may include at least one electrode or a plurality of electrodes 47A-N, as further disclosed herein.

According to exemplary embodiments, catheter 40 may be configured to map and/or ablate tissue areas of a cardiac chamber of heart 26. Inset 45 shows catheter 40 in an enlarged view, inside a cardiac chamber of heart 26. As shown, catheter 40 may include at least one electrode (or a plurality of electrodes 47A-N) coupled onto the body of the catheter 40. According to other exemplary embodiments, multiple elements may be connected via splines that form the shape of the catheter 40. One or more other elements (not shown) may be provided and may be any elements configured to ablate or to obtain biometric data and may be electrodes, transducers, or one or more other elements.

According to implementations disclosed herein, the electrodes, such as electrodes 47A-N, may be configured to transmit electromagnetic signals such a single catheter may have multiple electrodes 47A-N that each transmit a unique electromagnetic signal. The electromagnetic signals from a first electrode may be distinguishable from the electromagnetic signal from a second electrode based on any distinguishable attribute such as, but not limited to, frequency, phase, waveform, wavelength, etc.

The catheter 40 may also be configured to sense biometric data. For example, one or more electrodes 47A-N may be configured to sense biometric data while the catheter is inserted into a patient's body. Biometric data may include one or more of LATs, electrical activity, topology, bipolar mapping, dominant frequency, impedance, or the like. The local activation time may be a point in time of a threshold activity corresponding to a local activation, calculated based on a normalized initial starting point. Electrical activity may be any applicable electrical signals that may be measured based on one or more thresholds and may be sensed and/or augmented based on signal to noise ratios and/or other filters. A topology may correspond to the physical structure of a body part or a portion of a body part and may correspond to changes in the physical structure relative to different parts of the body part or relative to different body parts. A dominant frequency may be a frequency or a range of frequency that is prevalent at a portion of a body part and may be different in different portions of the same body part. For example, the dominant frequency of a pulmonary vein of a heart may be different than the dominant frequency of the right atrium of the same heart. Impedance may be the resistance measurement at a given area of a body part.

As shown in FIG. 1, the probe 21, and catheter 40 may be connected to a console 24. Console 24 may include a processor 41, such as a general-purpose computer, with suitable front end and interface circuits 38 for transmitting and receiving signals to and from catheter, as well as for controlling the other components of system 20. In some exemplary embodiments, processor 41 may be further configured to receive biometric data, such as electrical activity, and determine if a given tissue area conducts electricity. According to an exemplary embodiment, the processor may be external to the console 24 and may be located, for example, in the catheter, in an external device, in a mobile device, in a cloud-based device, or may be a standalone processor.

As noted above, processor 41 may include a general-purpose computer, which may be programmed in software to carry out the functions described herein. The software may be downloaded to the general-purpose computer in electronic form, over a network, for example, or it may, alternatively or additionally, be provided and/or stored on non-transitory tangible media, such as magnetic, optical, or electronic memory. The example configuration shown in FIG. 1 may be modified to implement the exemplary embodiments disclosed herein. The disclosed exemplary embodiments may similarly be applied using other system components and settings. Additionally, system 20 may include additional components, such as elements for sensing electrical activity, wired or wireless connectors, processing and display devices, or the like.

According to an embodiment, a display connected to a processor (e.g., processor 41) may be located at a remote location such as a separate hospital or in separate healthcare provider networks. Additionally, the system 20 may be part of a surgical system that is configured to obtain anatomical and electrical measurements of a patient's organ, such as a heart, and performing a cardiac ablation procedure. An example of such a surgical system is the Carto® system sold by Biosense Webster.

The system 20 may also, and optionally, obtain biometric data such as anatomical measurements of the patient's heart using ultrasound, computed tomography (CT), magnetic resonance imaging (MRI) or other medical imaging techniques known in the art. The system 20 may obtain electrical measurements using catheters, electrocardiograms (EKGs) or other sensors that measure electrical properties of the heart. The biometric data including anatomical and electrical measurements may then be stored in a memory 42 of the mapping system 20, as shown in FIG. 1. The biometric data may be transmitted to the processor 41 from the memory 42. Alternatively, or in addition, the biometric data may be transmitted to a server 60, which may be local or remote, using a network 62.

Network 62 may be any network or system generally known in the art such as an intranet, a local area network (LAN), a wide area network (WAN), a metropolitan area network (MAN), a direct connection or series of connections, a cellular telephone network, or any other network or medium capable of facilitating communication between the mapping system 20 and the server 60. The network 62 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 62.

In some instances, the server 62 may be implemented as a physical server. In other instances, server 62 may be implemented as a virtual server a public cloud computing provider (e.g., Amazon Web Services (AWS)®).

Control console 24 may be connected, by a cable 39, to body surface electrodes 43, which may include adhesive skin patches that are affixed to the patient 28. The processor, in conjunction with a current tracking module, may determine position coordinates of the catheter 40 inside the body part (e.g., heart 26) of a patient. The position coordinates may be based on impedances or electromagnetic fields measured between the body surface electrodes 43 and the electrode 48 or other electromagnetic components of the catheter 40. Additionally or alternatively, location pads may be located on the surface of bed 29 and may be separate from the bed 29.

Processor 41 may comprise real-time noise reduction circuitry typically configured as a field programmable gate array (FPGA), followed by an analog-to-digital (A/D) ECG (electrocardiogramG (electromyogram) signal conversion integrated circuit. The processor 41 may pass the signal from an A/D ECG or EMG circuit to another processor and/or can be programmed to perform one or more functions disclosed herein.

Control console 24 may also include an input/output (I/O) communications interface that enables the control console to transfer signals from, and/or transfer signals to electrodes 47A-N.

During a procedure, processor 41 may facilitate the presentation of a body part rendering 35 to physician 30 on a display 27, and store data representing the body part rendering 35 in a memory 42. Alternatively or in addition, the processor 41 may facilitate the presentation of all or a portion of a patient's body, such as from a catheter insertion point to above a heart.

Memory 42 may comprise any suitable volatile and/or non-volatile memory, such as random-access memory or a hard disk drive. In some implementations, medical professional 30 may be able to manipulate a body part rendering 35 using one or more input devices such as a touch pad, a mouse, a keyboard, a gesture recognition apparatus, or the like. For example, an input device may be used to change the position of catheter 40 such that rendering 35 is updated. In alternative exemplary embodiments, display 27 may include a touchscreen that can be configured to accept inputs from medical professional 30, in addition to presenting a body part rendering 35.

Figure 2:
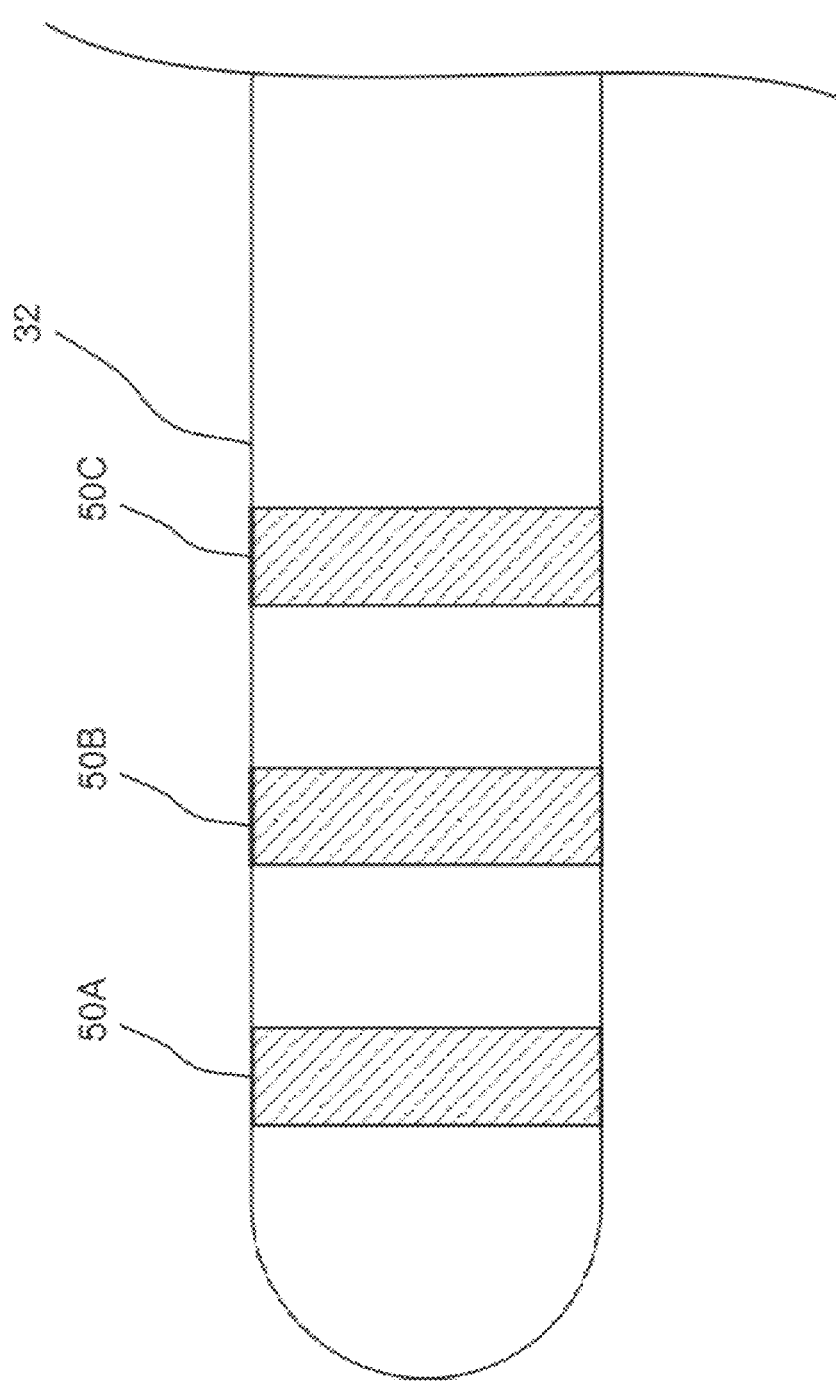
FIG. 2 is a diagram of a catheter with electrodes, in accordance with implementations of the disclosed subject matter.

FIG. 2 shows an example catheter 32 which may be the same as or similar to catheter 40 of FIG. 1. During a medical procedure, a catheter, such as catheter 32 may initially be inserted into a patient through a natural orifice or via an incision in the patient's body. The catheter 32 may be guided through the patient's body until it reaches a desired location (e.g., a heart chamber). As shown, catheter 32 may include a number of electrodes 50A through 50C. It will be understood that the electrodes 50A through 50C may be arranged in any applicable manner and that the arrangement shown in FIG. 2 is an example only.

Figure 3:
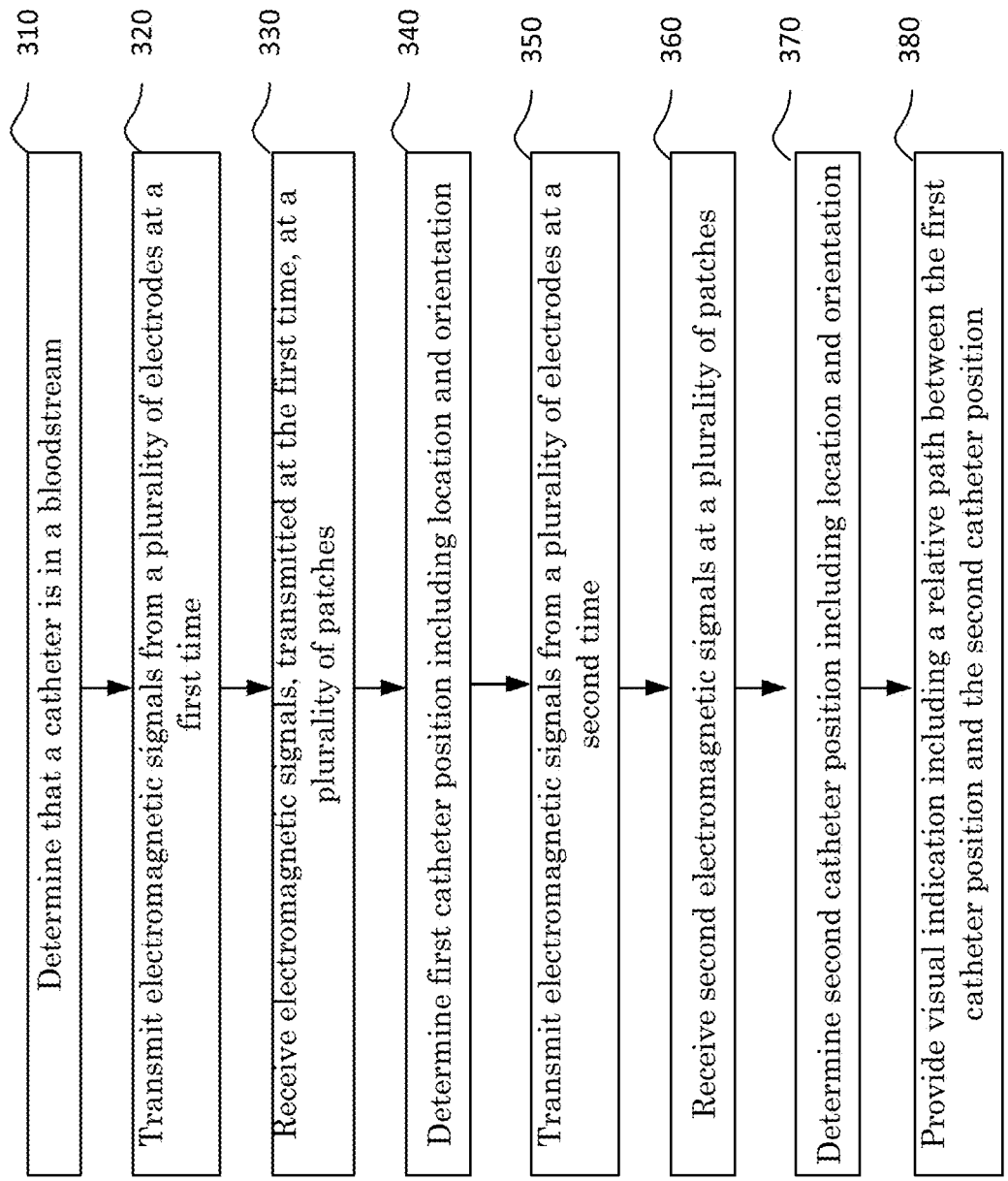
FIG. 3 is a flowchart for determining catheter positions, in accordance with implementations of the disclosed subject matter.

FIG. 3 shows a process 300 for determining a catheter position, according to implementations of the disclosed subject matter. As shown in FIG. 3, at step 310 of process 300, a determination that a catheter (e.g., catheter 40 of FIG. 1 or catheter 32 of FIG. 2) has entered the bloodstream of a patient may be made. At step 320, a plurality of electrodes on the catheter may transmit first electromagnetic signals at a first time. At step 330, the first electromagnetic signals transmitted at the first time may be received by a plurality of patches located on the patient's body. At step 340, a first catheter position, including a location and an orientation, may be determined based on the first electromagnetic signals received by the plurality of patches on the patient's body. At step 350, the plurality of electrodes on the catheter may transmit electromagnetic signals at a second time, subsequent to the first time. At step 360, the electromagnetic signals transmitted at the second time may be received by the plurality of patches located on the patient's body. At step 370, a second catheter position, including a location and an orientation, may be determined based on the second electromagnetic signals received by the plurality of patches on the patient's body at the second time. At step 380, a visual indication may be provided that includes the relative path between the first catheter position and the second catheter position.

As shown in the process 300 of FIG. 3, at step 310, a determination that a catheter (e.g., catheter 40 of FIG. 1 or catheter 32 of FIG. 2) has entered the bloodstream of a patient, may be made. The determination that a catheter has entered a patient's bloodstream may be made, for example, based on impedance values detected by a component (e.g., electrode) of the catheter. Notably, the patches may sense electromagnetic signals transmitted by catheter electrodes and an electrode impedance is also determined. If a given electrode is not in a bloodstream, then the current sensed by the one or more patches is low and the detected impedance is high. Accordingly, the catheter is determined not to be in the bloodstream. For example, a catheter component may be calibrated such that an impedance threshold value of X Ohms may correspond to a 99% likelihood that the component is not contact with blood. Accordingly, a determination that a catheter not has entered a patient's bloodstream may made based on if a sensed impedance reading by the catheter component is higher than or equal to X Ohms. Further, the electromagnetic signal amplitude received at the one or more patches may also be factored when determining if a catheter has entered a bloodstream.

Notably, the catheter may enter the patient's bloodstream via any applicable manner such as via a natural orifice or via an incision (e.g., laparoscopic incision) surgically created to insert the catheter. Prior to the catheter entering the patient's bloodstream, one or more of the catheter components may detect a prior impedance that does not meet the threshold impedance value. This prior impedance may be detected while the catheter is in a protective casing, while the catheter is exposed to air, or the like.

According to an implementation, the techniques disclosed herein, including steps 320-370 of the process 300 described in FIG. 3, may be implemented upon the determination that a catheter is in a patient's bloodstream. For example, determining that a catheter is in a patient's bloodstream may trigger step 320 of the process 300 described in FIG. 3, as further disclosed herein. According to this implementation, a determination that a catheter is in a patient's bloodstream may correspond to a "first time", as disclosed herein in relation to step 320.

At step 320 of the process 300 described in FIG. 3, electromagnetic signals may be transmitted form a plurality of electrodes of a catheter, at a first time. According to implementations disclosed herein, each of a plurality of electrodes of a catheter may transmit the electromagnetic signals at the first time. For example, a first electrode of a catheter may transmit first electromagnetic signals at the first time and a second electrode of the catheter may transmit second electromagnetic signals at the first times. Electromagnetic signals (e.g., first and second electromagnetic signals) may include properties that may distinguish the electromagnetic signals transmitted by a first electrode from the electromagnetic signals transmitted by a second electrode. The properties may be one or more of a frequency, phase, waveform, wavelength, or the like.

Figure 4B:
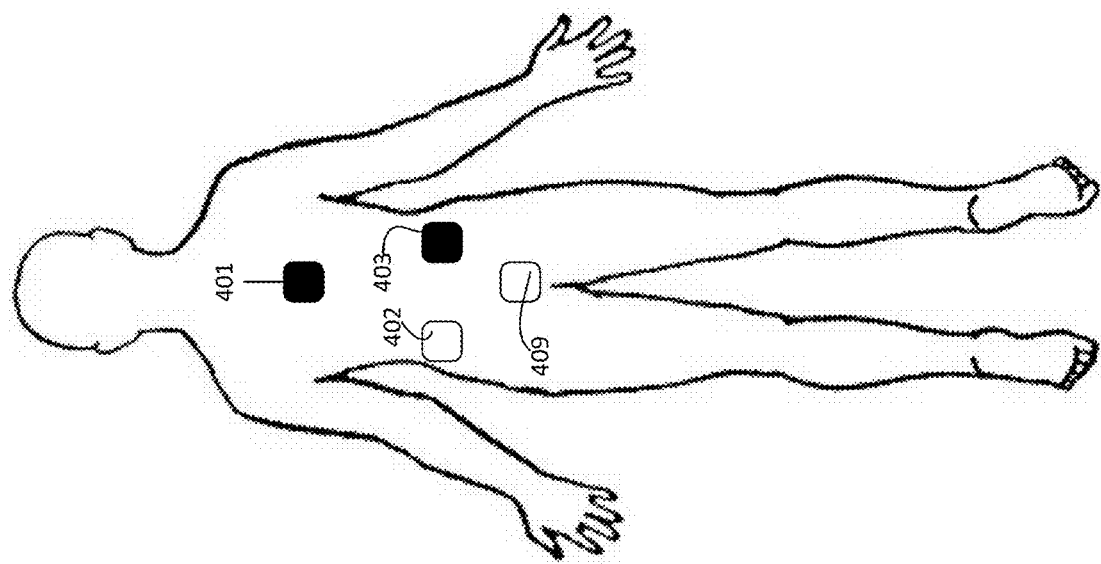
FIG. 4B is an illustration of a plurality of patches on a second surface of a patient's body, in accordance with implementations of the disclosed subject matter.
Figure 4A:
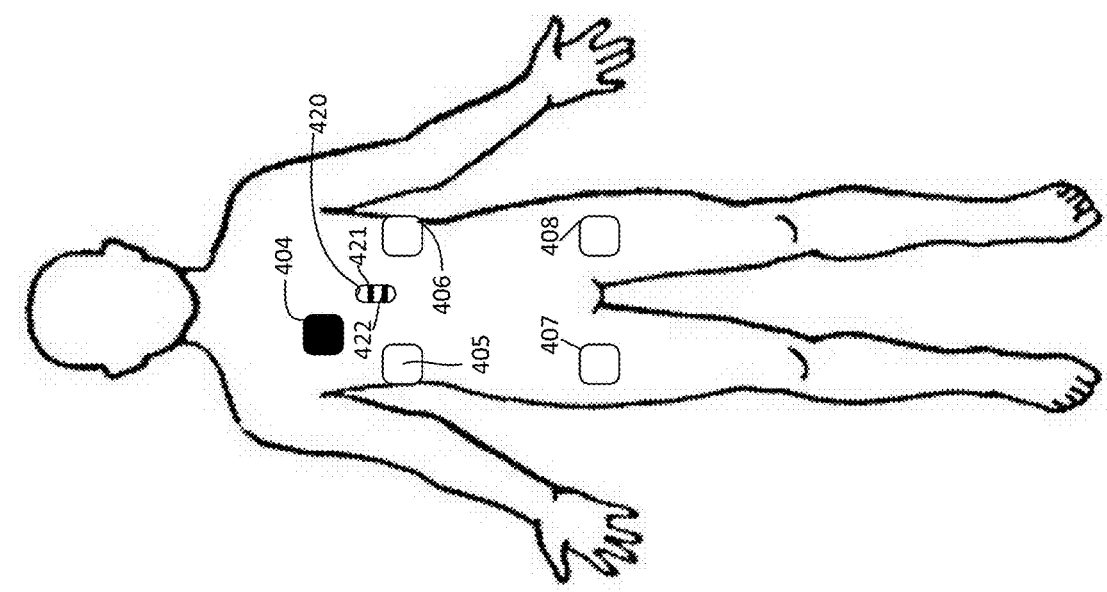
FIG. 4A is an illustration of a plurality of patches on a first surface of a patient's body, in accordance with implementations of the disclosed subject matter.

FIG. 4A shows a diagram of the front surface of a patient's body and FIG. 4B shows a diagram of a back surface of the patient's body. The front surface of the patient's body includes patches 404, 405, 406, 407 and 408 and the back surface of the patient's body includes patches 401, 402, 403, and 409. The patches 401-409 may be attached to the patient's body in any applicable manner including via an adhesive, via a mechanical connection, via an insertion into the surface of the patient's skin, via a frictional component, or a combination thereof. It will be understood that the number and configuration of patches may vary and that the number and configuration shown in FIGS. 4A, 4B and throughout this disclosure are for example purposes only.

As shown in FIGS. 4A and 4B, a catheter 420 may be inserted into the patient's body. The catheter 420 may include at least two electrodes 421 and 422 that are each configured to transmit electromagnetic signals that may be received by one or more of the patches 401-409. Accordingly, at step 320 of the process 300 described in FIG. 3, the electrode 421 of catheter 420 may transmit first electromagnetic signals and electrode 422 of catheter 420 may transmit second electromagnetic signals.

At step 330 of the process 300 described in FIG. 3, a plurality of patches may receive the electromagnetic signals transmitted, at a first time, by a plurality of electrodes of a catheter. Notably, based on the distance of a given electrode from a given patch, one or more attributes of an electromagnetic signal emitted by a given electrode and received by a given patch may differ from a different electromagnetic signal emitted by another electrode and received by the given patch. For example, a first electrode may be closer to a first patch than a second electrode. Accordingly, electromagnetic signals transmitted by the first electrode, as received at the first patch, may have a higher power amplitude than the electromagnetic signals transmitted by the second electrode, as received by the first patch, based on the amplitude attenuation that may occur over the larger distance that the electromagnetic signals transmitted by the second electrode traverse. Alternatively, electromagnetic signals transmitted by the first electrode, as received at the first patch, may be received by the first patch sooner than the electromagnetic signals transmitted by the second electrode, as received by the first patch, based on the time it takes to traverse the larger distance that the electromagnetic signals transmitted by the second electrode traverse.

In the example provided in FIGS. 4A and 4B, the electrode 421 is closer to patch 404 than electrode 422. Accordingly, the patch 404 would receive electromagnetic signals transmitted by electrode 421 at a first time such that the received signals have a higher amplitude than the electromagnetic signals received by the patch 404 as transmitted, at the first time, by electrode 422.

According to an implementation of the disclosed subject matter, signals provided for two or more patches may be combined prior to being analyzed by a processor to determine a catheter position. For example, as shown in FIGS. 4A and 4B, signals from patches that are not darkened (i.e., 402, 405, 406, 407, 408, and 409) may be combined when being analyzed by a processor. The signals to be combined may be from patches such that two or more patches may create a virtual line in a given direction, and a component of the catheter location, perpendicular to the virtual line, may be determined based on the combined signals provided by the two or more patches. FIG. 6A, as further disclosed herein, shows an implementation combining signals from patches 407 and 405 as well as patches 408 and 406.

According to an example, the signals from patches 405 and 407 may be combined and the signals from patches 406 and 408 may be combined when determining the position of a catheter in a left to right direction relative to the patient's body. Specifically, signals from patches 405 and 407 may be combined (e.g., sum or normalized sum) and may represent the left side of the patient's body, as further disclosed at step 340 of process 300, and signals from patches 406 and 408 may be combined (e.g., sum or normalized sum) and may represent the right side of the patient's body. Notably, the pair of patches 406 and 408 may be positioned such that they have approximately at the same directional coordinate in the direction that is perpendicular to the direction being measured using the combined signal from the patches 406 and 408. Similarly, the pair of patches 405 and 407 may be positioned such that they have approximately at the same directional coordinate in the direction that is perpendicular to the direction being measured using the combined signal from the patches 406 and 408. To clarify, patches 406 and 408 may have the same coordinate in a left to right direction of the patient's body and patches 405 and 407 may have the same coordinate in the left to right direction of the patient's body, and the signals from the pairs of patches may be used to determine the position of a catheter in the left to right direction. Notably, in this example, when determining the position of the catheter in the left to right direction, the difference in signal between, for example, patch 405 and patch 407 may be less relevant because they each have approximately at the same At step 340 of the process 300 described in FIG. 3, a first catheter position of the catheter inserted into a patient's body may be determined. The first catheter position may include a location and an orientation of the catheter. The first catheter position may be determined based on the electromagnetic signals transmitted by a plurality of electrodes of the catheter, at a first time, and based on those electromagnetic signals being received by a plurality of patches.

As disclosed herein, a catheter position, such as the first catheter position determined at step 340 of process 300, may include a location and an orientation. The location of a catheter may be determined based on the electromagnetic signals transmitted by any one of a plurality of electrodes of the catheter, by a plurality of electromagnetic signals transmitted by the plurality of electrodes, or by a combination thereof. For example, the location of a catheter may be determined based on the amplitude of electromagnetic signals transmitted by a single electrode and received at a plurality of patches, when a single. Alternatively, multiple electrodes may transmit electromagnetic signals and a determination may be made that the signals transmitted by a single electrode are of the greatest quality (e.g., least signal to noise ratio, highest QRS factor, or the like). Accordingly, the electromagnetic signals from that electrode may be used to determine location of a catheter. Alternatively, multiple electrodes may transmit electromagnetic signals and a plurality of patches may receive each of the signals. A mathematical calculation, such as an average, may be applied to determine a representative electromagnetic signal that factors in each of the plurality of electromagnetic signals and that representative electromagnetic signal may be used to determine the location of the catheter. A processor, such as processor 41 may be used for at least one of determining the time duration between a first time of transmission of an electromagnetic signal and may also be used to apply a mathematical calculation, as disclosed above. Techniques used to determine the location of a catheter are further disclosed herein in further detail.

Figure 4C:
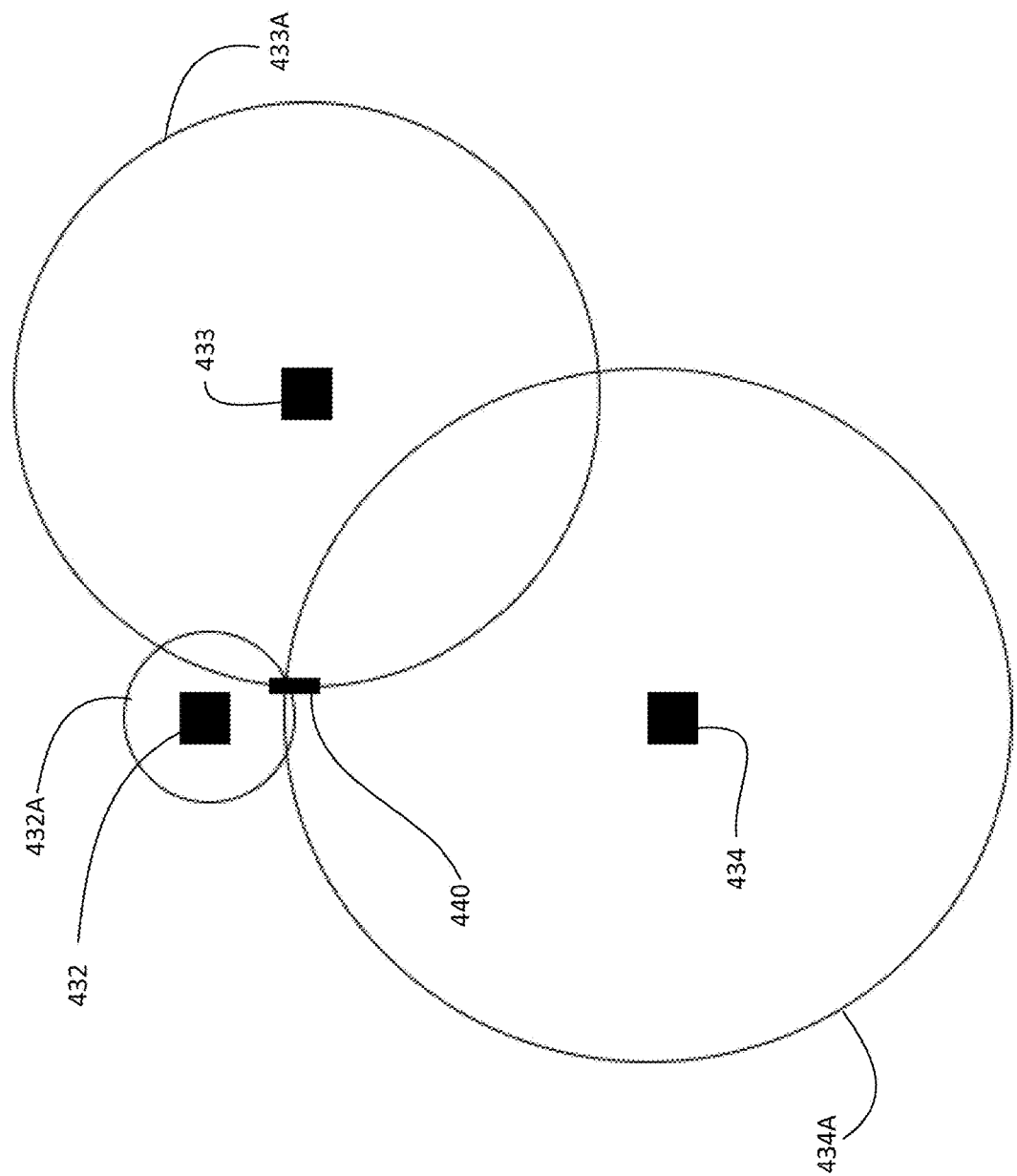
FIG. 4C is a diagram for determining catheter positions, in accordance with implementations of the disclosed subject matter.

FIG. 4C shows a technique that may be used to determine the location of a catheter based on electromagnetic signals transmitted by at least one electrode and received by a plurality of patches. Additional techniques for determining the location of a catheter are further disclosed herein.

As shown in FIG. 4C, a plurality of patches 432, 433, and 434 may receive electromagnetic signals transmitted by at least one electrode of catheter 440. Based on a property of the electromagnetic signals, such as the amplitude of the electromagnetic signals or duration of time between the transmission of the electromagnetic signals by at least one electrode and receipt of the electromagnetic signals by each of a plurality of patches, potential locations of the catheter, as determined by each of the plurality of patches may be determined. For example, as shown in FIG. 4C, at least one electrode of the catheter 440 may transmit electromagnetic signals at a first time. The electromagnetic signals may be received by each of the patches 432, 433, and 434.

According to an implementation, as shown in FIG. 4C, the amplitude of the respective received electromagnetic signals at each of the patches 432, 433, and 434 may be determined by, for example, a processor such as processor 41 of FIG. 1. Based on the amplitude of the respective received electromagnetic signals at each of the patches 432, 433, and 434, a potential distance of the catheter 440 from each of the patches 432, 433, and 434 may be determined. The potential distance may be a radius that corresponds to the given amplitude such that a higher amplitude detected at a given patch may correspond to a smaller radius such that the catheter may be closer to the given patch than a lower amplitude detected at the given patch which may indicate that the catheter is further from the given patch. As shown in the example provided in FIG. 4C, the potential distance of catheter 440 corresponding to patch 432 is represented by circle 432A, corresponding to patch 433 is represented by circle 433A, and corresponding to patch 434 is represented by circle 434A. Accordingly, the location of the catheter may be determined to be at the intersection of the potential distances 432A, 433A, and 434A, as shown in FIG. 4C. The intersection of the potential distances may be determined by a processor, such as processor 41 of FIG. 1.

Figure 4D:
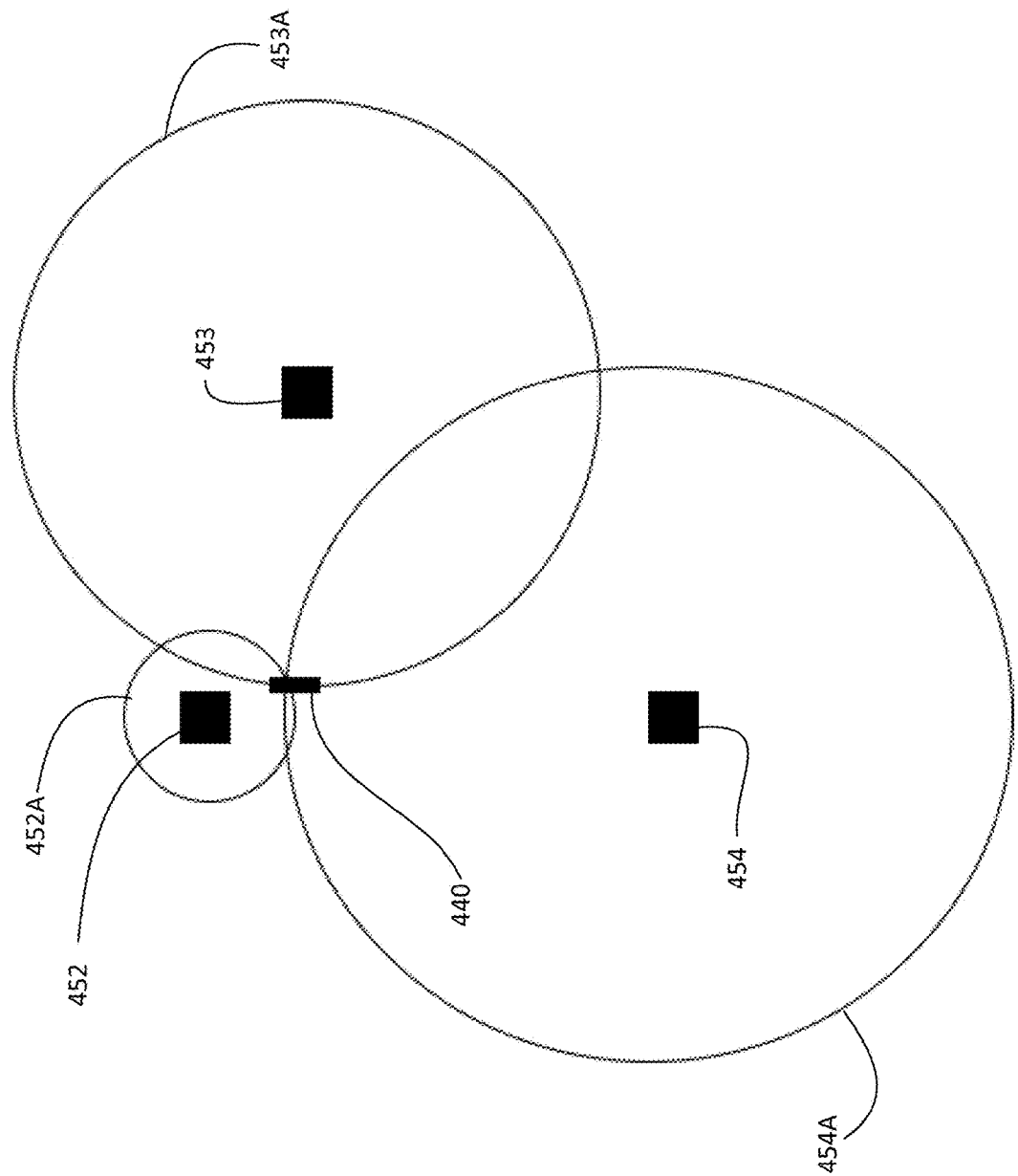
FIG. 4D is another diagram for determining catheter positions, in accordance with implementations of the disclosed subject matter.

According to another implementation, as shown in FIG. 4D, the time duration between transmission by an electrode and receipt of the respective received electromagnetic signals at each of the patches 452, 453, and 454 may be determined by, for example, a processor such as processor 41 of FIG. 1. Based on the time duration of receipt, from transmission, of the respective received electromagnetic signals at each of the patches 452, 453, and 454, a potential distance of the catheter 460 from each of the patches 452, 453, and 454 may be determined. The potential distance may be a radius that corresponds to the given time duration such that a shorter time duration between transmission by an electrode and receipt by a given patch may correspond to a smaller radius such that the catheter may be closer to the given patch than a higher time duration between transmission by the electrode and receipt by the given patch which may indicate that the catheter is further from the given patch. As shown in the example provided in FIG. 4D, the potential distance of catheter 460 corresponding to patch 452 is represented by circle 452A, corresponding to patch 453 is represented by circle 453A, and corresponding to patch 454 is represented by circle 454A. Accordingly, the location of the catheter may be determined to be at the intersection of the potential distances 452A, 453A, and 454A, as shown in FIG. 4C. The intersection of the potential distances may be determined by a processor, such as processor 41 of FIG. 1.

The orientation of a catheter may be determined by comparing the electromagnetic signals transmitted by each of a plurality of electrodes of a catheter, as disclosed herein. The first electromagnetic signals of a first electrode transmitted at a first time may be compared to the second electromagnetic signals of a second electrode transmitted at the first time. A difference in amplitude or time, as disclosed herein, may be used to determine the orientation of the catheter.

Figure 4E:
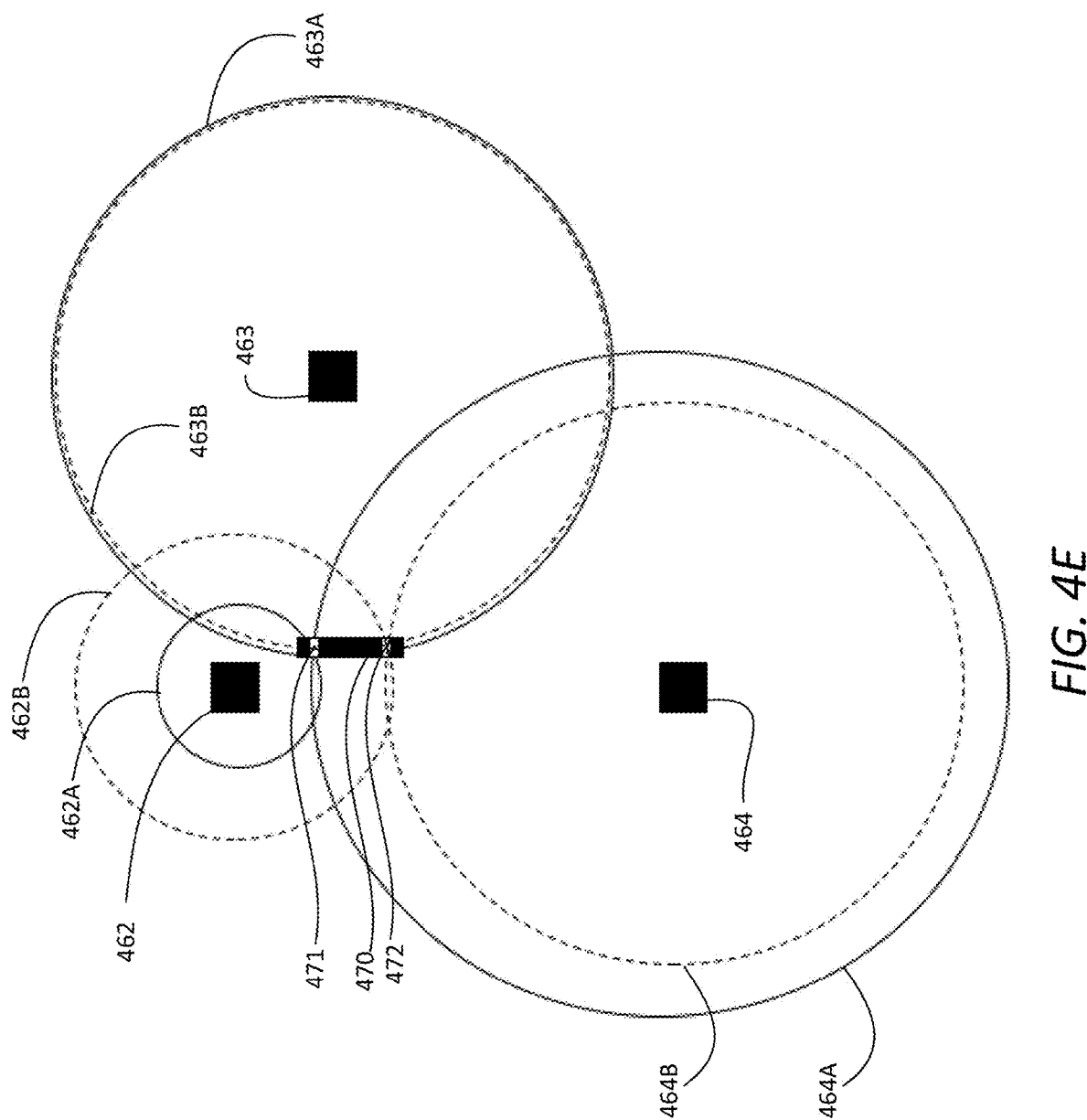
FIG. 4E is another diagram for determining catheter positions, in accordance with implementations of the disclosed subject matter.
Figure 4F:
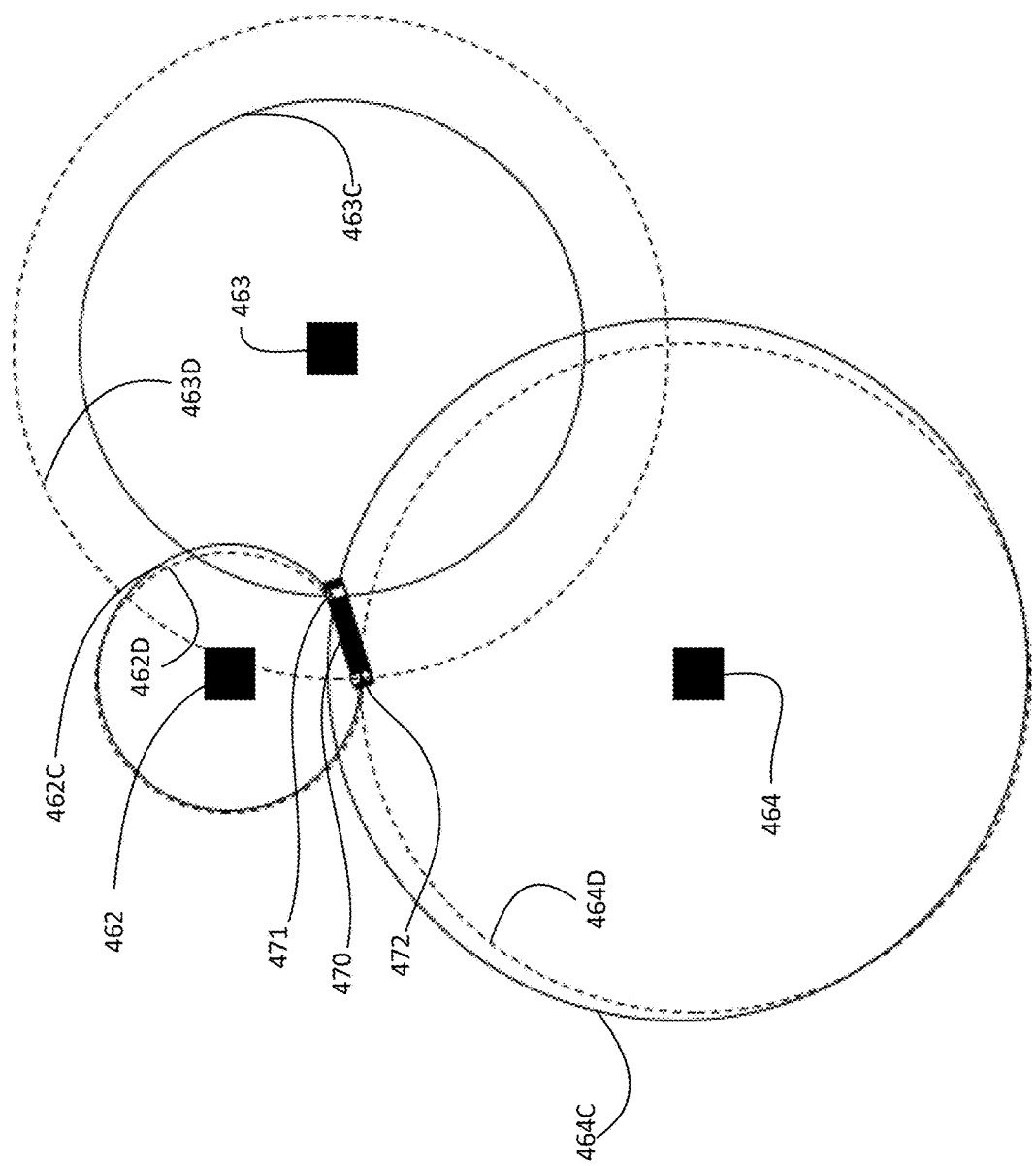
FIG. 4F is another diagram for determining catheter positions, in accordance with implementations of the disclosed subject matter.

The location of the electrode 471 and electrode 472 on the catheter 470 may be a known location or may be determined based on the example implementations described in FIGS. 4E and 4F (e.g., may be ascertained when determining the orientation of a given catheter).

According to an implementation, as shown in FIG. 4E, the catheter 470 may include two electrodes 471 and 472. Electrode 471 may transmit first electromagnetic signals and electrode 472 may transmit second electromagnetic signals. The amplitude of the respective received first and second electromagnetic signals at each of the patches 462, 463, and 464 may be determined by, for example, a processor such as processor 41 of FIG. 1. Based on the amplitude of the respective received electromagnetic signals at each of the patches 462, 463, and 464, a potential distance of the electrode 471 and 472 from each of the patches 462, 463, and 464 may be determined. The potential distance may be a radius that corresponds to the given amplitude such that a higher amplitude detected at a given patch may correspond to a smaller radius such that the catheter may be closer to the given patch than a lower amplitude detected at the given patch which may indicate that the catheter is further from the given patch. As shown in the example provided in FIG. 4E, the potential distance of electrode 471 corresponding to patch 462 is represented by circle 462A and of electrode 472 corresponding to patch 462 is represented by dotted circle 462B. The potential distance of electrode 471 corresponding to patch 463 is represented by circle 463A and of electrode 472 corresponding to patch 463 is represented by dotted circle 463B. The potential distance of electrode 471 corresponding to patch 464 is represented by circle 464A and of electrode 472 corresponding to patch 464 is represented by dotted circle 464B.

Accordingly, the location of the electrode 471 may be determined to be at the intersection of the potential distances 462A, 463A, and 464A, as shown in FIG. 4E and the location of the electrode 472 may be determined to be at the intersection of the potential distances 462B, 463B, and 464B. The intersection of the potential distances may be determined by a processor, such as processor 41 of FIG. 1. By determining the location of individual electrodes 471 and 472 of catheter 470, the orientation of the catheter may be determined by the processor.

Similarly, FIG. 4F shows the catheter 470 of FIG. 4E including two electrodes 471 and 472. The catheter 470 of FIG. 4F may be oriented different from the orientation of the catheter 470 in FIG. 4E. Electrode 471 may transmit first electromagnetic signals and electrode 472 may transmit second electromagnetic signals. The amplitude of the respective received first and second electromagnetic signals at each of the patches 462, 463, and 464 may be determined by, for example, a processor such as processor 41 of FIG. 1. Based on the amplitude of the respective received electromagnetic signals at each of the patches 462, 463, and 464, a potential distance of the electrode 471 and 472 from each of the patches 462, 463, and 464 may be determined, as described in relation to FIG. 4E. As shown in the example provided in FIG. 4F, the potential distance of electrode 471 corresponding to patch 462 is represented by circle 462C and of electrode 472 corresponding to patch 462 is represented by dotted circle 462D. The potential distance of electrode 471 corresponding to patch 463 is represented by circle 463C and of electrode 472 corresponding to patch 463 is represented by dotted circle 463D. The potential distance of electrode 471 corresponding to patch 464 is represented by circle 464C and of electrode 472 corresponding to patch 464 is represented by dotted circle 464D.

Accordingly, the location of the electrode 471 may be determined to be at the intersection of the potential distances 462C, 463C, and 464C, as shown in FIG. 4F and the location of the electrode 472 may be determined to be at the intersection of the potential distances 462D, 463D, and 464D. The intersection of the potential distances may be determined by a processor, such as processor 41 of FIG. 1. By determining the location of individual electrodes 471 and 472 of catheter 470, the orientation of the catheter may be determined by the processor.

Although the examples provided in FIGS. 4C-4F show the position of a catheter being determined in two dimensions, the same process may be applied in three dimensions using, for example, the radius of a sphere instead of the radius of a circle, and determining intersection points of the sphere to determine the location and orientation of a catheter.

Figure 5B:
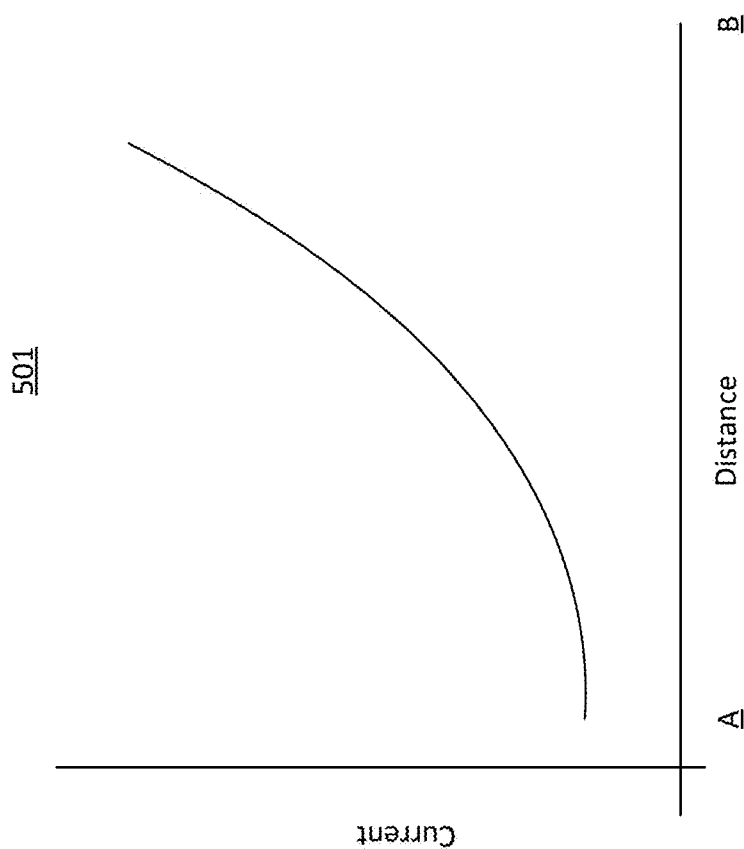
FIG. 5B is a graph illustrating the catheter position determined in FIG. 5A, in accordance with implementations of the disclosed subject matter.
Figure 5A:
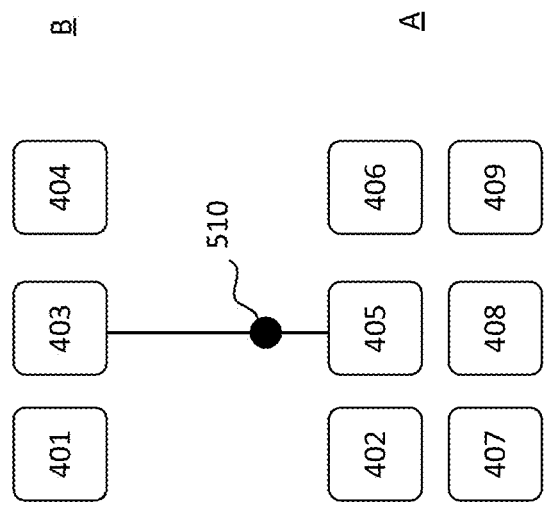
FIG. 5A is a diagram for determining a catheter position in a first direction, in accordance with implementations of the disclosed subject matter.
Figure 5C:
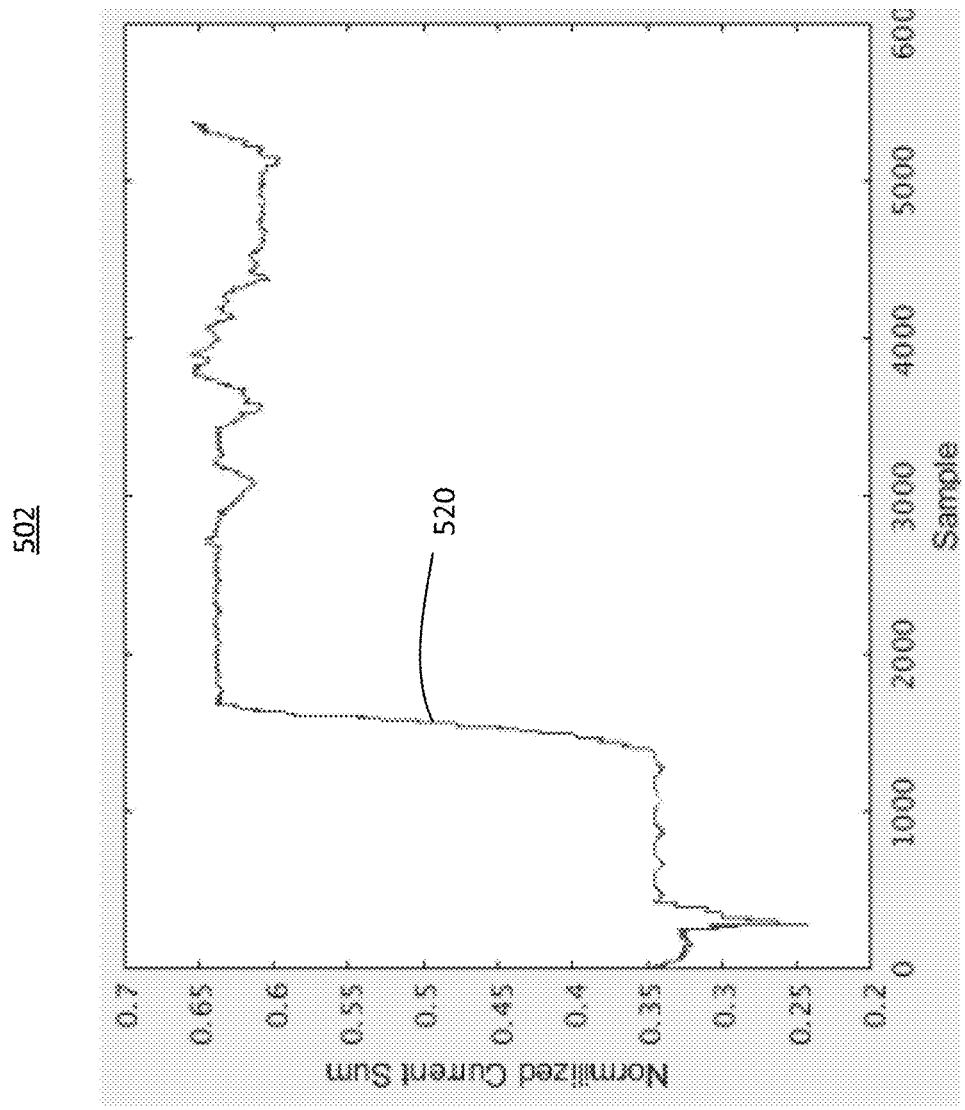
FIG. 5C is an experimental result graph illustrating the catheter position determined in FIG. 5A, in accordance with implementations of the disclosed subject matter.

According to another implementation, as shown in FIGS. 5A through 5C, the location of a catheter and/or at least one electrode may be determined relative to the patches applied to a patient's body. FIGS. 5A and 5B reference the patches shown in FIGS. 4A and 4B. As shown in FIG. 5A, a first dimension may be defined relative to the plurality of patches. The first dimension may be defined by a line between the normalized sum of the current received at patches 401, 403, and 404 ("top patches") which are located towards the face of the patient, as shown in FIGS. 4A and 4B and the normalized sum of patches 402, 405, 406, 407, 408, and 409 ("bottom patches") which are located towards the feet of the patient, as shown in FIGS. 4A and 4B. Notably, the first dimensions is relative to the position of the patches, and is not a pre-determined dimension. A plurality of electrodes on a catheter 510 may emit electromagnetic signals that are received by the top patches and the bottom patches such that when the catheter 510 is located proximate to the bottom patches, as shown in FIG. 5A, the normalized sum of the bottom patches is greater than the normalized sum of the top patches. Based on the difference between the normalized sums, a processor (e.g., processor 41 of FIG. 1) may determine the position of the catheter 510 in the first dimension, based on the difference in the normalized sums.

According to an implementation, as shown in chart 501 of FIG. 5B, the normalized sum of only a single set of patches (e.g., the top patches) may be received and a determination of the position of the catheter 510 may be determined based on the normalized sum of the single set of patches. As shown in the graph 501 of FIG. 5B, the normalized sum of current received at the top patches may be low when the catheter 510 is proximate to the bottom patches (e.g., as shown in FIG. 5A). As the normalized sum of the current received at the top patches increases, a processor may determine that the catheter 510 is more proximate to the top patches. FIGS. 5A and 5B indicate proximity to the bottom patches using the marker A and proximity to the top patches using the marker B.

FIG. 5C shows an chart 502 including an experimental reading 520 of the normalized sum of the current received at a number of patches (e.g., top patches). As shown, for the first ~1500 samples collected, the normalized sum of the current is approximately constant at 0.35. The first ~1500 may indicate that a catheter (e.g., catheter 510) may be stationary at a position that is approximately 35% of the distance between a first set of patches and a second set of patches in a given dimension. Between 1500 and 1700 samples, the normalized sum of the current shifts from approximately 0.35 to approximately 0.65. This change of current may indicate that a catheter (e.g., catheter 510) may move from a position that is approximately 35% of the distance between the first set of patches and the second set of patches in the given dimension to a position that is approximately 65% of the distance between the first set of patches and the second set of patches in the given dimension. The percentage of distance may be calculated from a set point, such as from the bottom set of patches, the top set of patches, or a location (e.g., center) relative to either set of patches.

Figure 6B:
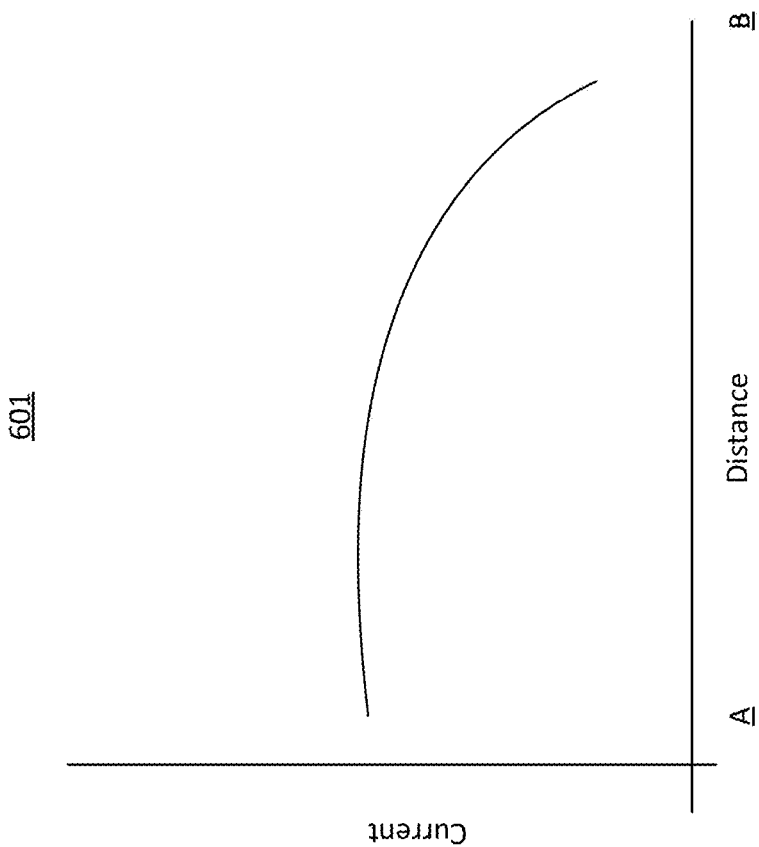
FIG. 6B is a graph illustrating the catheter position determined in FIG. 6A, in accordance with implementations of the disclosed subject matter.
Figure 6A:
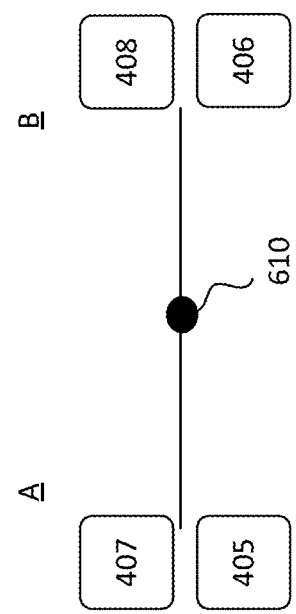
FIG. 6A is a diagram for determining a catheter position in a second direction, in accordance with implementations of the disclosed subject matter.

FIGS. 6A and 6B reference the patches shown in FIGS. 4A and 4B. As shown in FIG. 6A, a second dimension may be defined relative to the plurality of patches. The second dimension may be defined by a line between the sum or normalized sum of the current received at patches 407, and 405 ("left patches") which are located towards the left side of the patient's body, as shown in FIGS. 4A and 4B and the sum or normalized sum of patches 408 and 406 ("right patches") which are located towards the right side of the patient's body, as shown in FIGS. 4A and 4B. Notably, the second dimensions is relative to the position of the patches, and is not a pre-determined dimension. A plurality of electrodes on a catheter 510 may emit electromagnetic signals that are received by the left patches and the right patches such that when the catheter 610 is located between the right patches and the left patches, as shown in FIG. 6A, the sum or normalized sum of the current at the left patches is about the same as the sum or normalized sum of the right patches. Based on the difference between the normalized sums, a processor (e.g., processor 41 of FIG. 1) may determine the position of the catheter 610 in the second dimension, based on the difference between the sums or the normalized sums.

According to an implementation, as shown in the graph 601 of FIG. 6B, the sum or normalized sum of only a single set of patches (e.g., the left patches) may be received and a determination of the position of the catheter 610 may be determined based on the sum or normalized sum of the single set of patches. As shown in the graph 601 of FIG. 6B, the sum or normalized sum of current received at the right patches may be low when the catheter 610 is proximate to the left patches. As the sum or normalized sum of the current received at the right patches increases, a processor may determine that the catheter 610 is more proximate to the right patches. FIGS. 6A and 6B indicate proximity to the left patches using the marker A and proximity to the right patches using the marker B.

Figure 6C:
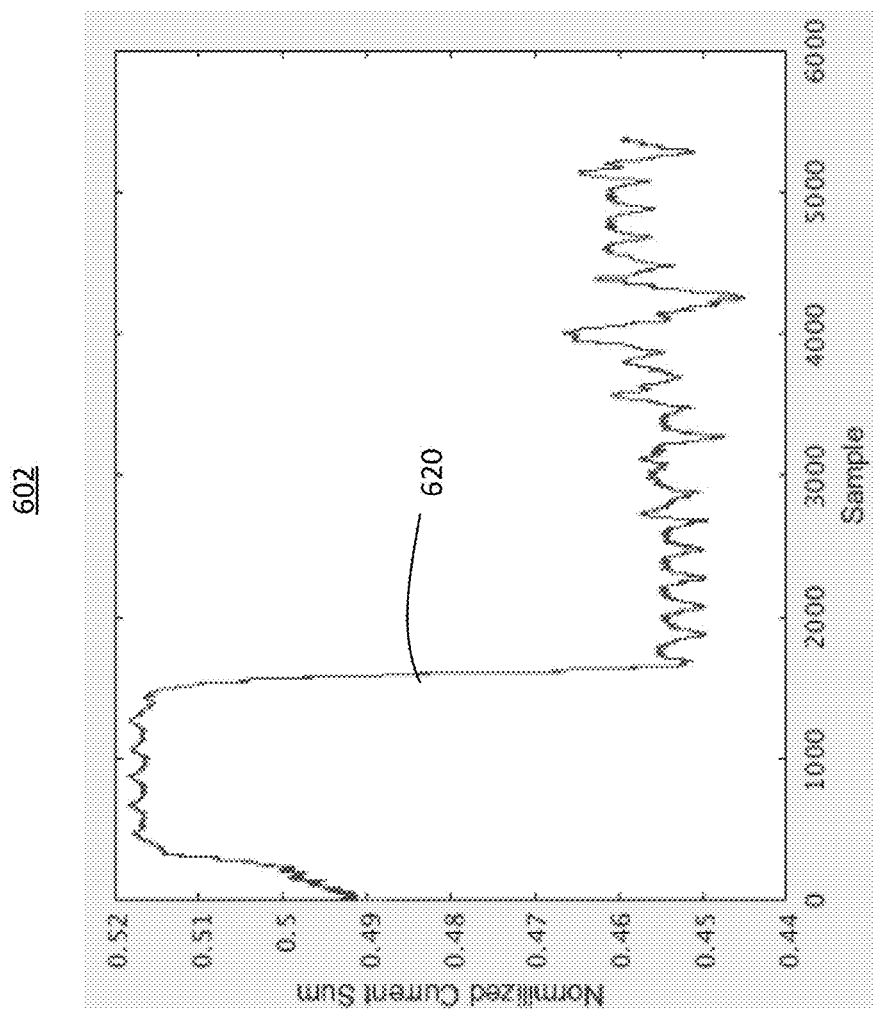
FIG. 6C is an experimental result graph illustrating the catheter position determined in FIG. 6A, in accordance with implementations of the disclosed subject matter.

FIG. 6C shows a graph 602 including an experimental reading 620 of the sum or normalized sum of the current received at a number of patches (e.g., left patches). As shown, for the first ~1200 samples collected, the sum or normalized sum of the current is approximately constant at 0.52. The first ~1200 may indicate that a catheter (e.g., catheter 610) may be stationary at a position that is approximately between distance between a first set of patches and a second set of patches in a given dimension. Between 1200 and 1700 samples, the normalized sum of the current shifts from approximately 0.52 to approximately. 45. This change of current may indicate that a catheter (e.g., catheter 610) moved from a position that is between the first set of patches and the second set of patches in the given dimension to a position that is approximately 45% of the distance between the first set of patches and the second set of patches in the given dimension. The percentage of distance may be calculated from a set point, such as from the bottom set of patches, the top set of patches, or a location (e.g., center) relative to either set of patches.

Figure 7B:
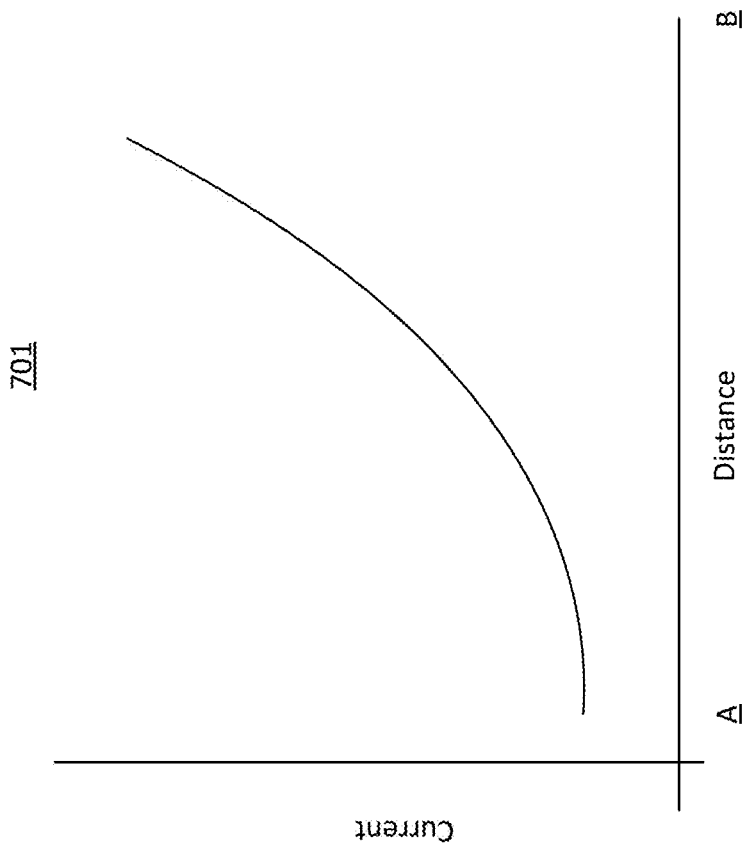
FIG. 7B is a graph illustrating the catheter position determined in FIG. 7A, in accordance with implementations of the disclosed subject matter.
Figure 7A:
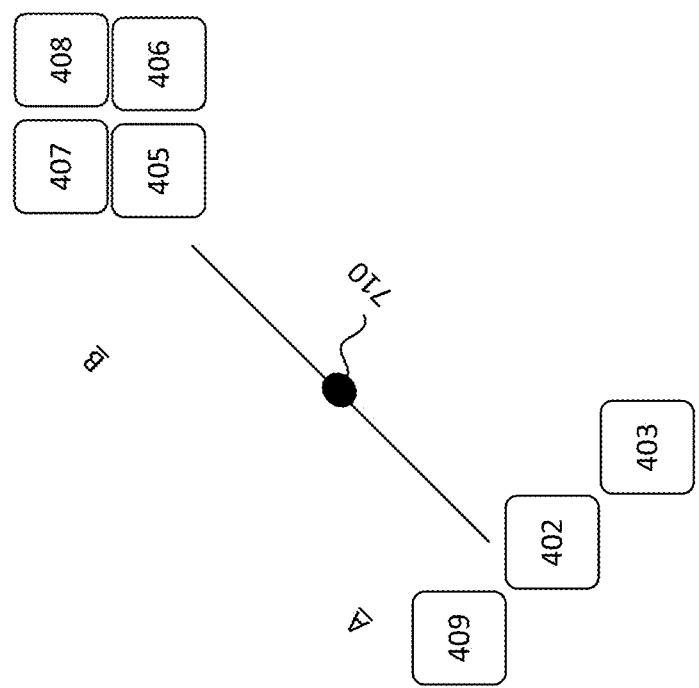
FIG. 7A is a diagram for determining a catheter position in a third direction, in accordance with implementations of the disclosed subject matter.

FIGS. 7A and 7B reference the patches shown in FIGS. 4A and 4B. As shown in FIG. 7A, a third dimension may be defined relative to the plurality of patches. The third dimension may be defined by a line between the sum or normalized sum of the current received at patches 407, 408, 405, and 406 ("upper patches") which are located on the upper surface of the patient's body, as shown in FIGS. 4A and 4B and the sum or normalized sum of patches 409, 402, and 403 ("lower patches") which are located on the bottom surface of the patient's body, as shown in FIGS. 4A and 4B. Notably, the third dimensions is relative to the position of the patches, and is not a pre-determined dimension. A plurality of electrodes on a catheter 710 may emit electromagnetic signals that are received by the upper patches and the lower patches such that when the catheter 710 is located between the upper patches and the lower patches, as shown in FIG. 7A, the sum or normalized sum of the current at the upper patches is about the same sum or normalized sum of the current at the lower patches. Based on the difference between the normalized sums, a processor (e.g., processor 41 of FIG. 1) may determine the position of the catheter 710 in the third dimension, based on the difference between the sums or the normalized sums.

According to an implementation, as shown in the graph 701 of FIG. 7B, the sum or normalized sum of only a single set of patches (e.g., the upper patches) may be received and a determination of the position of the catheter 710 may be determined based on the sum or normalized sum of the single set of patches. As shown in the graph 701 of FIG. 7B, the sum or normalized sum of current received at the upper patches may be low when the catheter 710 is proximate to the upper patches. As the sum or normalized sum of the current received at the lower patches increases, a processor may determine that the catheter 710 is more proximate to the lower patches. FIGS. 7A and 7B indicate proximity to the lower patches using the marker A and proximity to the upper patches using the marker B.

According to implementations of the disclosed subject matter, a catheter location may be determined based on a combination of the first, second, and third dimensions relative to the patches. The first dimension may provide a first three-dimensional coordinate relative to the patches, the second dimension may provide a second three-dimensional coordinate relative to the patches, and the third dimension may provide a third three-dimensional coordinate relative to the patches. Similarly, the coordinates of individual electrodes in the catheter may be provided to determine the orientation of the catheter, as disclosed herein.

Figure 8:
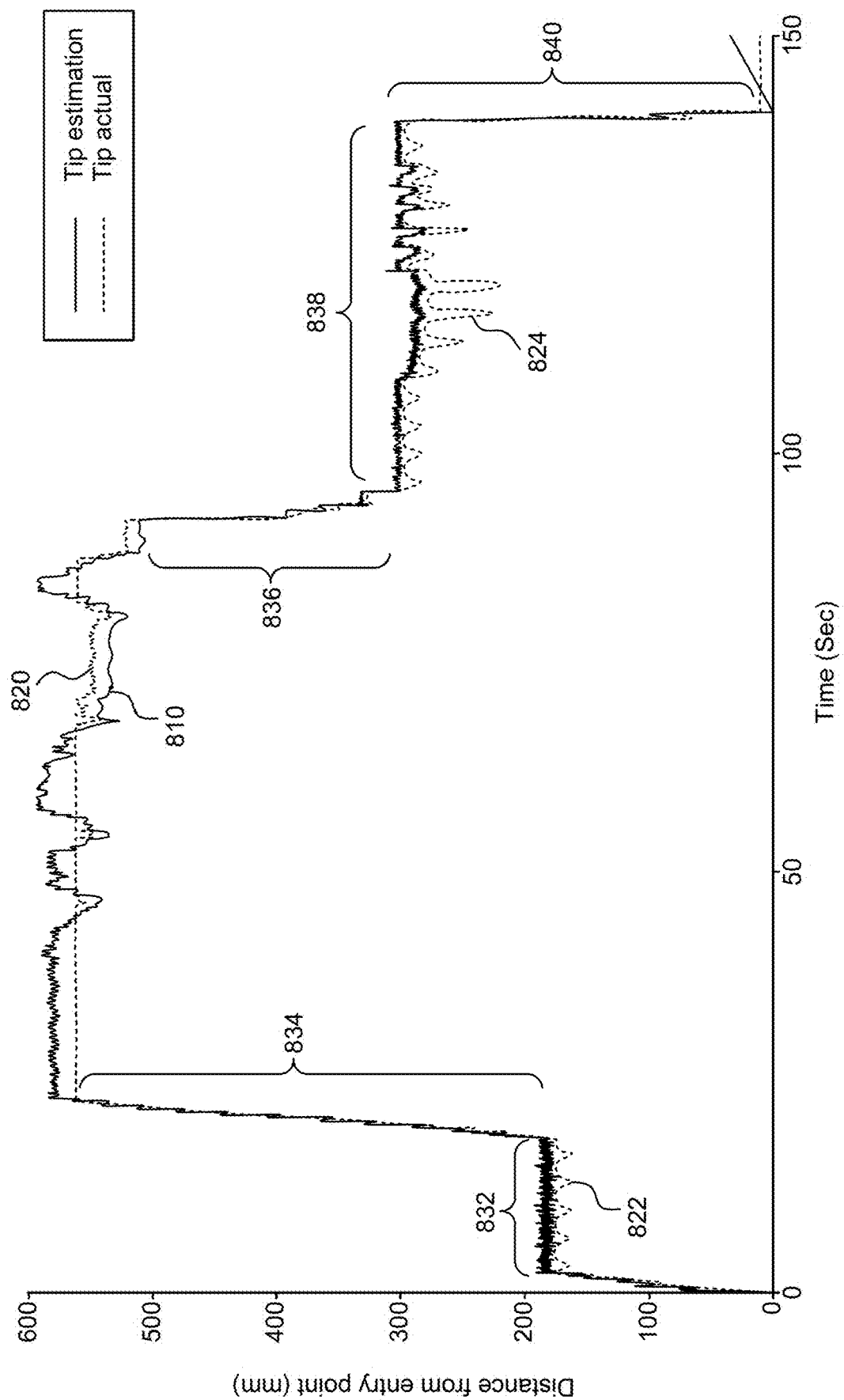
FIG. 8 is an experimental result graph illustrating the catheter position determined in FIG. 7A, in accordance with implementations of the disclosed subject matter.

FIG. 8 shows an experimental result of the distance from an entry point of a catheter as actually measured using a magnetic probe in combination with a location pad as well as estimated based on the techniques disclosed herein. For example, FIG. 8 shows the data collected based on an actual measurement and an estimated measurement for a single dimension (e.g., a first dimension of FIGS. 5A-5C), to test the accuracy of the techniques disclosed herein. It will be understood that the test would provide similar results if expanded to two or three dimensions. The actual measurement is indicated by line 810 and the estimated measurement is indicated by line 820. As shown in FIG. 8, the estimated measurement 820 obtained based on receiving electromagnetic signals emitted by electrodes of a catheter, at a plurality of patches, mirrors the actual measurements calculated using the magnetic probe in combination with the location pad.

As shown in FIG. 8 at 822 and 824, the estimated measurements may include patterns (e.g., cyclical patterns) that may be caused by bodily movement due to, for example, respiration, a heartbeat, or the like. According to an implementation, the pattern may be filtered from the estimated measurement by using an applicable filter such as a high pass filter, a low pass filter, or the like. As also shown in FIG. 8, during times 832, the catheter may be relatively stationary, may move further from the entry point during times 834, may move closer to the entry point during times 836, may be relatively stationary during times 838, and may move towards the entry point during times 840.

A second catheter position may be determined based on steps 350-370 of process 300 of FIG. 3. Steps 350-370 are similar to steps 320-340 of the process 300 and, accordingly, the details for each step are not reiterated herein for simplicity. At step 350 of the process 300 described in FIG. 3, the plurality of electrodes on the catheter may transmit electromagnetic signals at a second time, subsequent to the first time. At step 360, the electromagnetic signals transmitted at the second time may be received by the plurality of patches located on the patient's body. At step 370, a second catheter position, including a location and an orientation, may be determined based on the electromagnetic signals received by the plurality of patches on the patient's body at the second time.

Figure 9:
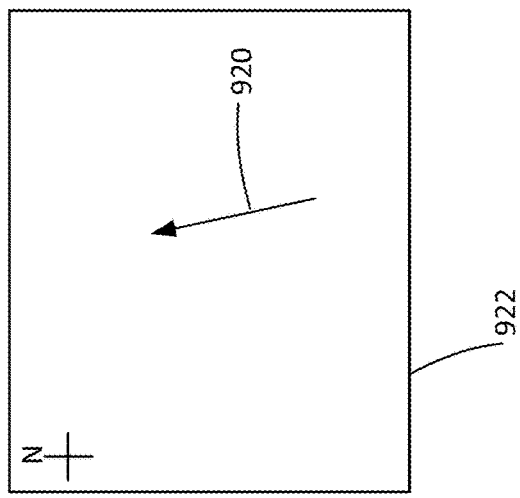
FIG. 9 is a diagram showing the path of a catheter and a catheter direction, in accordance with implementations of the disclosed subject matter.
Figure 9:
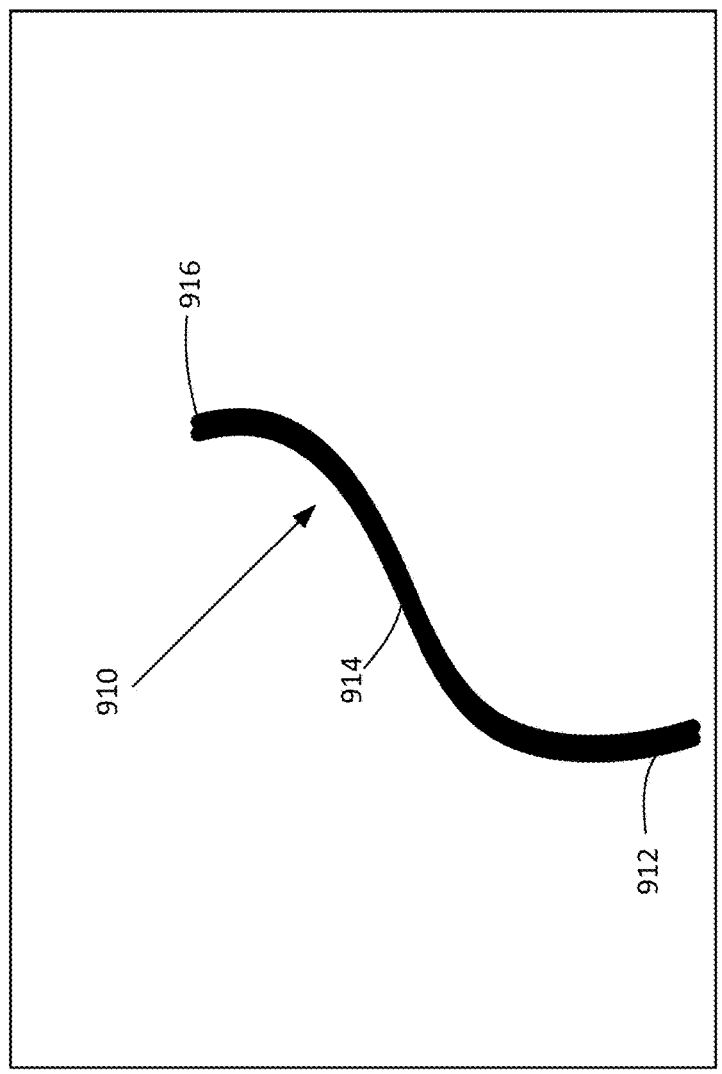

At step 380, a visual indication may be provided that includes the relative path between the first catheter position and the second catheter position. FIG. 9 shows an example visual indication 910 that indicates the path taken by catheter between a number of positions including a first position 912, a second position 914, and a third position 916. The visual indication may be provided on a display, such as display 27 of FIG. 1.

According to an implementation of the disclosed subject matter, a direction of movement of a catheter may be determined based on a first position and a second position of the catheter. The direction of movement may be determined based on the change in the first catheter position and the second catheter position. As an example, the direction of movement may be an arrow that may dynamically change as the direction of movement updates based on electromagnetic signals are transmitted by electrodes of a catheter. FIG. 9 shows an example direction of movement 920, in a direction box 922, based on recent positions of the catheter having the visual indication 910.

Any of the functions and methods described herein can be implemented in a general-purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer-readable media). The results of such processing can be maskworks that are then used in a semiconductor manufacturing process to manufacture a processor which implements features of the disclosure.

Any of the functions and methods described herein can be implemented in a computer program, software, or firmware incorporated in a non-transitory computer-readable storage medium for execution by a general-purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

It should be understood that many variations are possible based on the disclosure herein. Although features and elements are described above in particular combinations, each feature or element can be used alone without the other features and elements or in various combinations with or without other features and elements.

The invention claimed is:

1. A system comprising:
  a catheter comprising a first electrode and a second electrode, the first electrode configured to transmit first electromagnetic signals and the second electrode configured to transmit second electromagnetic signals, wherein the first electromagnetic signals and the second electromagnetic signals are distinguishable in at least one of frequency, phase, or amplitude;

a first patch, a second patch, and a third patch each configured to receive the first electromagnetic signals and the second electromagnetic signals, wherein the first patch, the second patch, and the third patch are arranged in a triangular formation on a first surface of a body of a patient; and one or more processors that are communicatively coupled to the first patch, the second patch, and the third patch, wherein the one or more processors are collectively configured to:

determine a first set of positions based on the first electromagnetic signals and the second electromagnetic signals received at the first patch, the second patch, and the third patch respectively during a first time period, wherein the first set of positions includes a first terminus of a radius in three-dimensional space originating from the first patch, a second terminus of a radius in three-dimensional space originating from the second patch, and a third terminus of a radius in three-dimensional space originating from the third patch, determine a first location of the catheter relative to the patient based on the first set of positions, determine a first orientation of the catheter at the first location by comparing the first electromagnetic signals and the second electromagnetic signals received at a same one of the first patch, the second patch, or the third patch during the first time period, wherein the first orientation indicates a direction the catheter is pointing within the patient at the first time period, and wherein the first orientation is calculated based on a relative time delay or amplitude difference between the first electromagnetic signals and the second electromagnetic signals received at a same patch, determine a second set of positions based on the first electromagnetic signals and the second electromagnetic signals received at the first patch, the second patch, and the third patch respectively during a second time period, wherein the second set of positions includes a fourth terminus of a radius in three-dimensional space originating from the first patch, a fifth terminus of a radius in three-dimensional space originating from the second patch, and a sixth terminus of a radius in three-dimensional space originating from the third patch, determine a second location of the catheter relative to the patient based on the second set of positions, determine a second orientation of the catheter at the second location by comparing the first electromagnetic signals and the second electromagnetic signals received at a same one of the first patch, the second patch, or the third patch during the second time period, wherein the second orientation indicates a direction the catheter is pointing within the patient at the second time period, and wherein the second orientation is calculated based on a relative time delay or amplitude difference between the first electromagnetic signals and the second electromagnetic signals received at the same patch, and display a first catheter position and a second catheter position relative to the first catheter position such that the first catheter position is visually connected to the second catheter position by a vector segment, wherein the first catheter position includes the first location and first orientation, and the second catheter position includes the second location and the second orientation.

2. The system of claim 1, wherein:

the first orientation is determined based on a first comparison of the first electromagnetic signals to the second electromagnetic signals received by the at least one of at the first patch, the second patch, or the third patch during the first time period, and the second orientation is determined based on a second comparison of the first electromagnetic signals to the second electromagnetic signals received by the at least one of at the first patch, the second patch, or the third patch during the first time period.

3. The system of claim 2, wherein the first comparison and the second comparison are based on a difference in time between the first electromagnetic signals to the second electromagnetic signals.

4. The system of claim 2, wherein the first comparison and the second comparison are based on a difference in amplitude between the first electromagnetic signals to the second electromagnetic signals.

5. The system of claim 1, further comprising a fourth patch on a second surface of the body of the patient opposite the first surface of the body of the patient, and wherein at least one of the first location or the second location is further determined based on the first electromagnetic signals and the second electromagnetic signals received at the fourth patch.

6. The system of claim 1, further comprising a fourth patch on the first surface, wherein:

the first patch and the fourth patch create a first directional line, at least one of the first location or the second location is further determined based on the combination of the first electromagnetic signals and the second electromagnetic signals received at the first patch and the fourth patch.

7. The system of claim 6, wherein a first component of the first catheter position perpendicular to the first directional line is determined based on the combination of the first electromagnetic signals and the second electromagnetic signals received at the first patch and the fourth patch.

8. The system of claim 7, wherein a second component of the first catheter position is further determined based on the first electromagnetic signals and the second electromagnetic signals received at least one of the second patch and the third patch.

9. The system of claim 1, wherein the one or more processors are further collectively further configured to:

determine that the catheter is in a bloodstream based on an impedance value sensed by at least one of the first electrode or the second electrode exceeds a threshold impedance; and determine at least one of the first location or the second location based on determining that the catheter is in the bloodstream.

10. The system of claim 1, wherein the one or more processors are further collectively configured to:

provide a visual indication of a direction of movement based on the first catheter position and the second catheter position.

11. The system of claim 1, wherein the one or more processors are further collectively configured to:

filter cyclical respiratory movements from at least one of the first catheter position and the second catheter position.

12. A method comprising:
transmitting first electromagnetic signals from a first electrode of a catheter;
transmitting second electromagnetic signals from a second electrode of the catheter, wherein the first electromagnetic signals and the second electromagnetic signals are distinguishable in at least one of frequency, phase, or amplitude;
receiving the first electromagnetic signals and the second electromagnetic signals by each of a first patch, a second patch, and a third patch, wherein the first patch, the second patch, and the third patch are arranged in a triangular formation on a first surface of a body of a patient;
determining a first set of positions based on the first electromagnetic signals and the second electromagnetic signals received at the first patch, the second patch, and the third patch respectively during a first time period, wherein the first set of positions includes a first terminus of a radius in three-dimensional space originating from the first patch, a second terminus of a radius in three-dimensional space originating from the second patch, and a third terminus of a radius in three-dimensional space originating from the third patch;
determining a first location of the catheter relative to the patient based on the first set of positions;
determining a first orientation of the catheter at the first location by comparing the first electromagnetic signals and the second electromagnetic signals received at a same one of the first patch, the second patch, or the third patch during the first time period, wherein the first orientation indicates a direction the catheter is pointing within the patient at the first time period, and wherein the first orientation is calculated based on a relative time delay or amplitude difference between the first electromagnetic signals and the second electromagnetic signals received at a same patch;
determining a second set of positions based on the first electromagnetic signals and the second electromagnetic signals received at the first patch, the second patch, and the third patch respectively during a second time period, wherein the second set of positions includes a fourth terminus of a radius in three-dimensional space originating from the first patch, a fifth terminus of a radius in three-dimensional space originating from the second patch, and a sixth terminus of a radius in three-dimensional space originating from the third patch;
determining a second location of the catheter relative to the patient based on the second set of positions;
determining a second orientation of the catheter at the second location by comparing the first electromagnetic signals and the second electromagnetic signals received at a same one of the first patch, the second patch, or the third patch during the second time period, wherein the second orientation indicates a direction the catheter is pointing within the patient at the second time period, and wherein the second orientation is calculated based on a relative time delay or amplitude difference between the first electromagnetic signals and the second electromagnetic signals received at the same patch; and
displaying a first catheter position and a second catheter position relative to the first catheter position such that the first catheter position is visually connected to the second catheter position by a vector segment, wherein the first catheter position includes the first location and the first orientation and the second catheter position includes the second location and the second orientation.

13. The method of claim 12, wherein:
the first orientation is determined based on a first comparison of the first electromagnetic signals to the second electromagnetic signals received by the at least one of at the first patch, the second patch, or the third patch during the first time period, and
the second orientation is determined based on a second comparison of the first electromagnetic signals to the second electromagnetic signals received by the at least one of at the first patch, the second patch, or the third patch during the first time period.

14. The method of claim 13, wherein the first comparison and the second comparison are based on a difference in time between the first electromagnetic signals to the second electromagnetic signals.

15. The method of claim 13, wherein the first comparison and the second comparison are based on a difference in amplitude between the first electromagnetic signals to the second electromagnetic signals.

16. The method of claim 12, further comprising:
receiving the first electromagnetic signals and the second electromagnetic signals at a fourth patch on a second body surface opposite the first surface of the body; and
determining at least one of the first location or the second location based on the first electromagnetic signals and the second electromagnetic signals received at the fourth patch.

17. The method of claim 12, further comprising
receiving the first electromagnetic signals and the second electromagnetic signals at a fourth patch on the first surface, wherein:
the first patch and the fourth patch create a first directional line, and
at least one of the first location or the second location determined based on the combination of a signal strength of the first electromagnetic signals and the second electromagnetic signals received at the first patch and the fourth patch.

18. The method of claim 17, wherein a first component of the first catheter position perpendicular to the first directional line is determined based on the combination of the first electromagnetic signals and the second electromagnetic signals received at the first patch and the fourth patch.

19. The method of claim 18, wherein a second component of the first catheter position is determined based on the first electromagnetic signals and the second electromagnetic signals received at least one of the second patch and the third patch.

20. The method of claim 12, further comprising:
determining that the catheter is in a bloodstream based on an impedance value sensed by at least one of the first electrode or the second electrode exceeds a threshold impedance; and
determining at least one of the first location or the second location based on determining that the catheter is in the bloodstream.

* * * * *

UNITED STATES PATENT AND TRADEMARK OFFICE
CERTIFICATE OF CORRECTION

PATENT NO. : 12,496,432 B2
APPLICATION NO. : 16/799338
DATED : December 16, 2025
INVENTOR(S) : Elad Azaria et al.

Page 1 of 1

It is certified that error appears in the above-identified patent and that said Letters Patent is hereby corrected as shown below:

On the Title Page

Item (72), under "Inventors", in Column 1, Line 3, delete "Hertzliya" and insert -- Herzliya --, therefor.

In the Specification

In Column 5, Line 5, delete "such a" and insert -- such as a --, therefor.
In Column 6, Line 38, delete "server a" and insert -- server in a --, therefor.
In Column 6, Line 55, delete (electrocardiogramG" and insert -- (electrocardiograph) or EMG --, therefor.
In Column 7, Line 67, delete "not contact" and insert -- not in contact --, therefor.
In Column 8, Line 27, delete "form" and insert -- from --, therefor.
In Column 10, Line 3, delete "same" and insert -- same. --, therefor.
In Column 12, Line 29, delete "different" and insert -- differently --, therefor.
In Column 14, Line 39, delete "approximately. 45." and insert -- approximately 0.45. --, therefor.
In Column 16, Line 39, delete "media)." and insert -- medium). --, therefor.

In the Claims

In Column 20, Line 34, in Claim 17, delete "comprising" and insert -- comprising: --, therefor.

Signed and Sealed this
Tenth Day of February, 2026

John A. Squires
*Director of the United States Patent and Trademark Office*